United States Patent
Xie et al.

(10) Patent No.: US 12,477,819 B2
(45) Date of Patent: Nov. 18, 2025

(54) STACKED FET WITH EXTREMELY SMALL CELL HEIGHT

(71) Applicant: INTERNATIONAL BUSINESS MACHINES CORPORATION, Armonk, NY (US)

(72) Inventors: Ruilong Xie, Niskayuna, NY (US); Chen Zhang, Guilderland, NY (US); Albert M. Young, Fishkill, NY (US); Brent A. Anderson, Jericho, VT (US); Kisik Choi, Watervliet, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 18/054,194

(22) Filed: Nov. 10, 2022

(65) Prior Publication Data

US 2024/0162229 A1    May 16, 2024

(51) Int. Cl.
*H01L 21/768* (2006.01)
*H01L 21/8238* (2006.01)
(Continued)

(52) U.S. Cl.
CPC ..... *H10D 84/853* (2025.01); *H01L 21/76831* (2013.01); *H01L 23/481* (2013.01);
(Continued)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 8,450,149 B2   5/2013   Bayan
8,912,661 B2   12/2014  Mcgrath
(Continued)

FOREIGN PATENT DOCUMENTS

CN   111106110 A   5/2020
CN   113424307 A   9/2021
(Continued)

OTHER PUBLICATIONS

"Patent Cooperation Treaty PCT Notification of Transmittal of the International Search Report and the Written Opinion of the International Searching Authority, or the Declaration", Applicant's file reference F23W4657, International application No. PCT/CN2023/129565, International filing date Nov. 3, 2023, Date of Mailing Jan. 31, 2024, 9 pages.

(Continued)

*Primary Examiner* — David C Spalla
(74) *Attorney, Agent, or Firm* — Samuel A. Waldbaum

(57) ABSTRACT

A microelectronic structure including a first stacked FET device that includes a first bottom FET device and a first upper FET device. The first bottom FET device include a plurality of first bottom channel layers, and the first upper FET device includes a plurality of first upper channel layers. A bottom gate that surrounds the plurality of first bottom channel layers and an upper gate that surrounds the plurality of first upper channel layers. A gate protrusion that extends downwards from the backside of the upper gate to connected to the bottom gate. The gate protrusion partially overlaps with a bottom gate cut region of the first bottom stacked FET device, and the gate protrusion partially overlaps with an upper gate cut region of the first upper stacked FET device.

20 Claims, 29 Drawing Sheets

CROSS-SECTION Y2

(51) Int. Cl.
*H01L 23/48* (2006.01)
*H01L 29/06* (2006.01)
*H01L 29/417* (2006.01)
*H01L 29/66* (2006.01)
*H01L 29/775* (2006.01)
*H01L 29/786* (2006.01)
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)
*H10D 84/85* (2025.01)

(52) U.S. Cl.
CPC .......... *H10D 30/014* (2025.01); *H10D 30/43* (2025.01); *H10D 30/6729* (2025.01); *H10D 30/6757* (2025.01); *H10D 62/121* (2025.01); *H10D 84/0167* (2025.01); *H10D 84/017* (2025.01); *H10D 84/038* (2025.01)

(58) Field of Classification Search
CPC .......... H10D 30/6212; H10D 30/6213; H10D 30/6219; H10D 30/6713; H10D 30/6729; H10D 30/6735; H10D 30/6757; H10D 30/797; H10D 62/021; H10D 62/1118; H10D 62/119; H10D 62/121; H10D 62/49; H10D 62/151; H10D 84/013; H10D 84/0158; H10D 84/0193; H10D 84/0167; H10D 84/017; H10D 84/038; H10D 84/834; H10D 84/853; H10L 21/76831; H01L 23/481
See application file for complete search history.

(56) References Cited

U.S. PATENT DOCUMENTS

| | | | |
|---|---|---|---|
| 10,192,819 | B1 | 1/2019 | Chanemougame |
| 10,192,867 | B1 | 1/2019 | Frougier |
| 10,236,217 | B1 * | 3/2019 | Ando ................ H10D 62/121 |
| 10,510,622 | B1 * | 12/2019 | Frougier ............. H10D 88/01 |
| 10,985,103 | B2 | 4/2021 | Hong |
| 2019/0304984 | A1 * | 10/2019 | Chang ................ H10D 30/62 |
| 2020/0098921 | A1 | 3/2020 | Rachmady |
| 2020/0266169 | A1 | 8/2020 | Kang |
| 2020/0294998 | A1 | 9/2020 | Lilak |
| 2020/0402984 | A1 * | 12/2020 | Reznicek .......... H01L 21/02532 |
| 2021/0184000 | A1 * | 6/2021 | Ramaswamy ....... H10D 64/017 |
| 2021/0366907 | A1 * | 11/2021 | Liao .................. H10D 84/038 |
| 2021/0407999 | A1 * | 12/2021 | Huang ............... H10D 62/121 |
| 2022/0109046 | A1 * | 4/2022 | Hong ................ H10D 84/0167 |
| 2022/0130991 | A1 | 4/2022 | Yu |
| 2022/0336456 | A1 | 10/2022 | Hong |

FOREIGN PATENT DOCUMENTS

| | | |
|---|---|---|
| CN | 113594158 A | 11/2021 |
| CN | 113764523 A | 12/2021 |
| CN | 114388608 A | 4/2022 |
| DE | 102020103710 A1 | 9/2020 |
| TW | 202209415 A | 3/2022 |
| TW | 202236530 A | 9/2022 |

OTHER PUBLICATIONS

Ryckaert et al., "Extending the roadmap beyond 3nm through system scaling boosters: A case study on Buried Power Rail and Backside Power Delivery", 2019 Electron Devices Technology and Manufacturing Conference (EDTM), 2019 IEEE, pp. 50-52.

Ryckaert et al., "The Complementary FET (CFET) for CMOS scaling beyond N3", 2018 Symposium on VLSI Technology Digest of Technical Papers, 2018 IEEE, pp. 141-142.

* cited by examiner

CROSS-SECTION Y1

CROSS-SECTION Y2

CROSS-SECTION X

CROSS-SECTION Y1

CROSS-SECTION Y2

CROSS-SECTION X

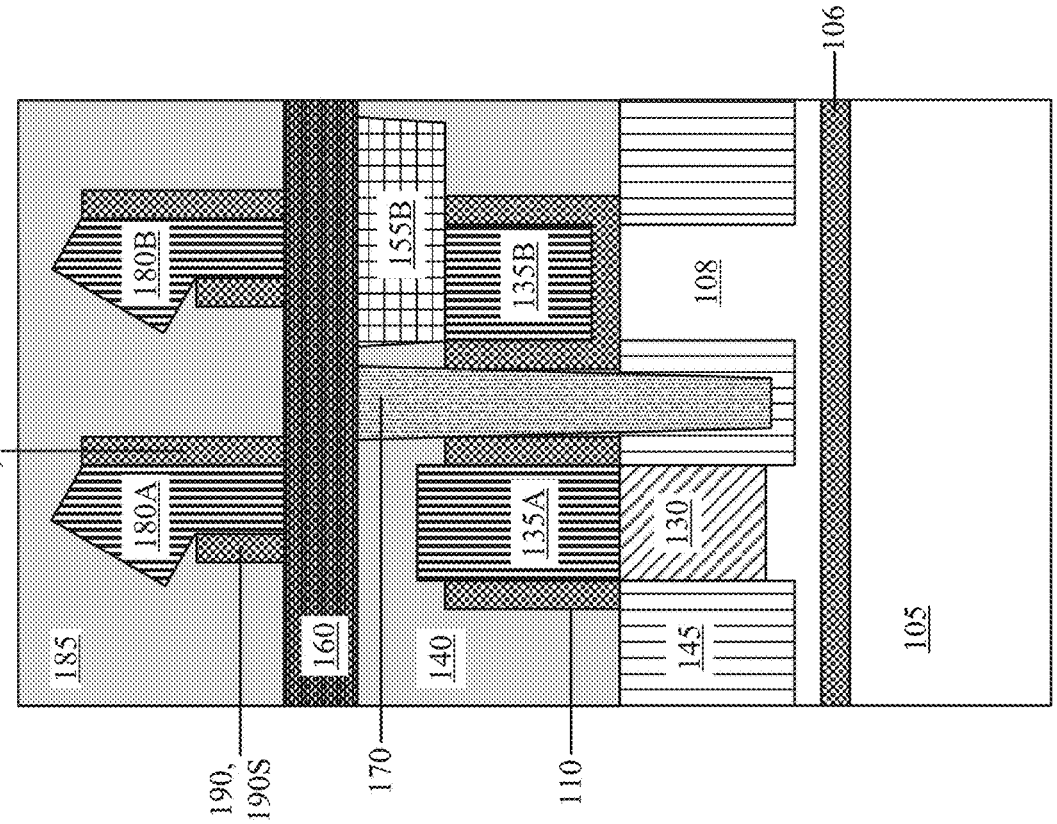
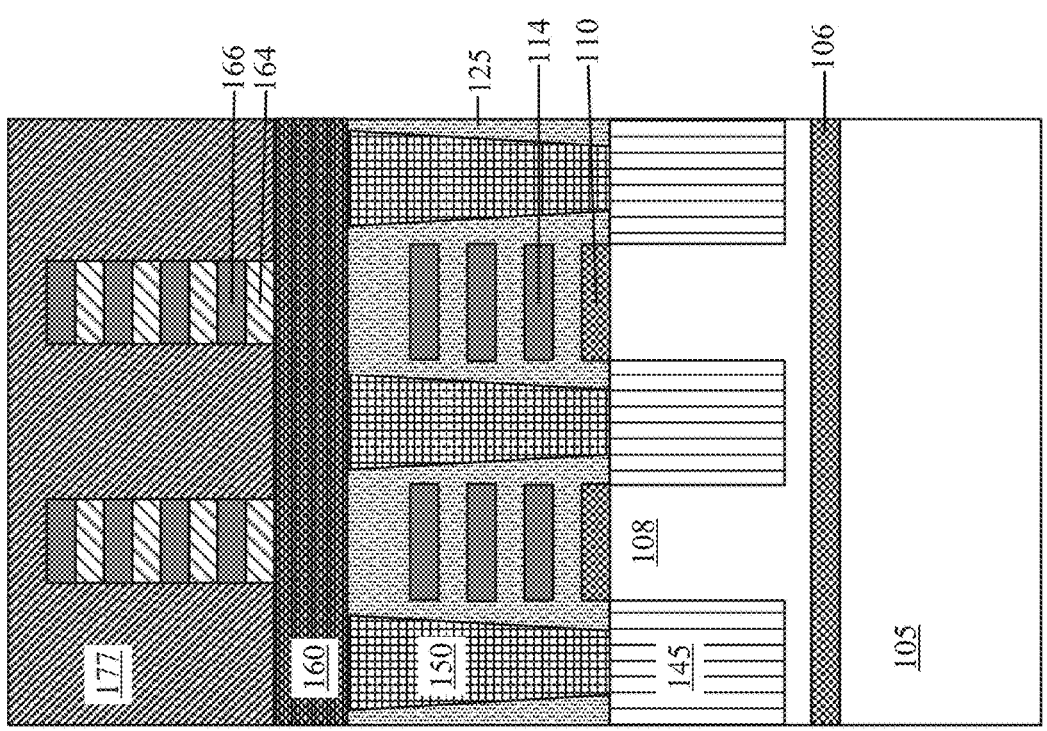

CROSS-SECTION X

CROSS-SECTION Y2

CROSS-SECTION Y1

CROSS-SECTION X

CROSS-SECTION Y2

CROSS-SECTION Y1

CROSS-SECTION X

CROSS-SECTION Y1

CROSS-SECTION Y2

CROSS-SECTION X

CROSS-SECTION Y1

CROSS-SECTION Y2

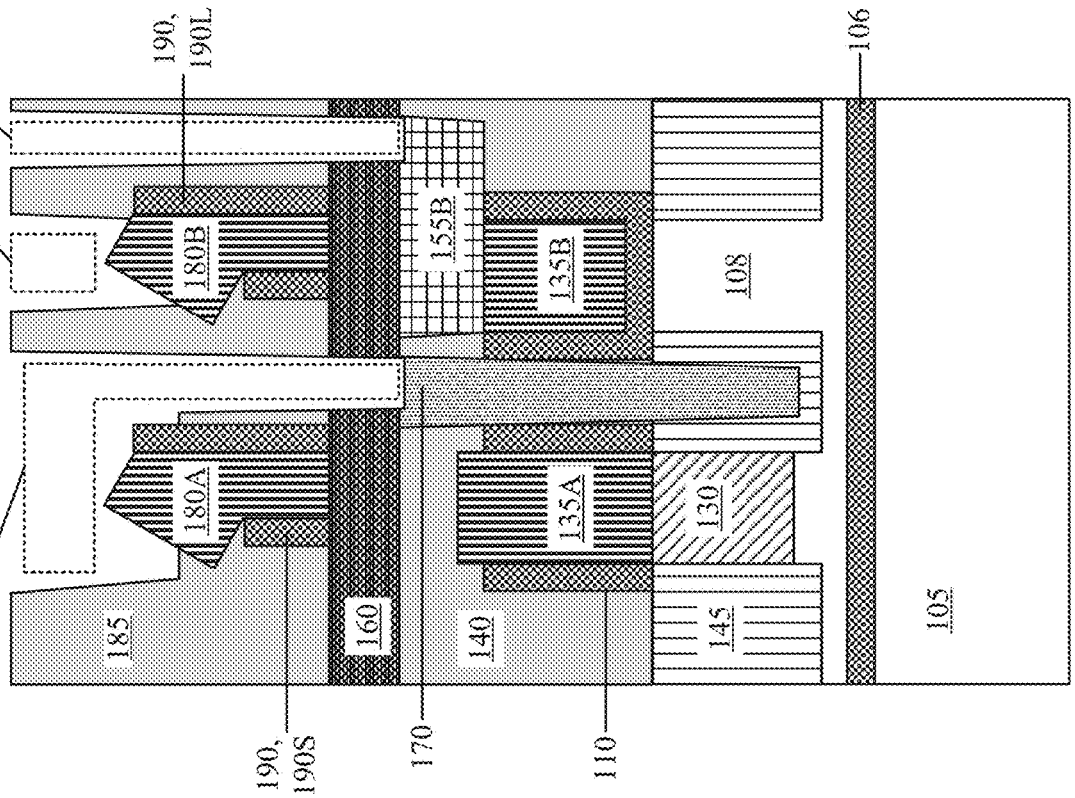
FIG. 25 CROSS-SECTION Y2
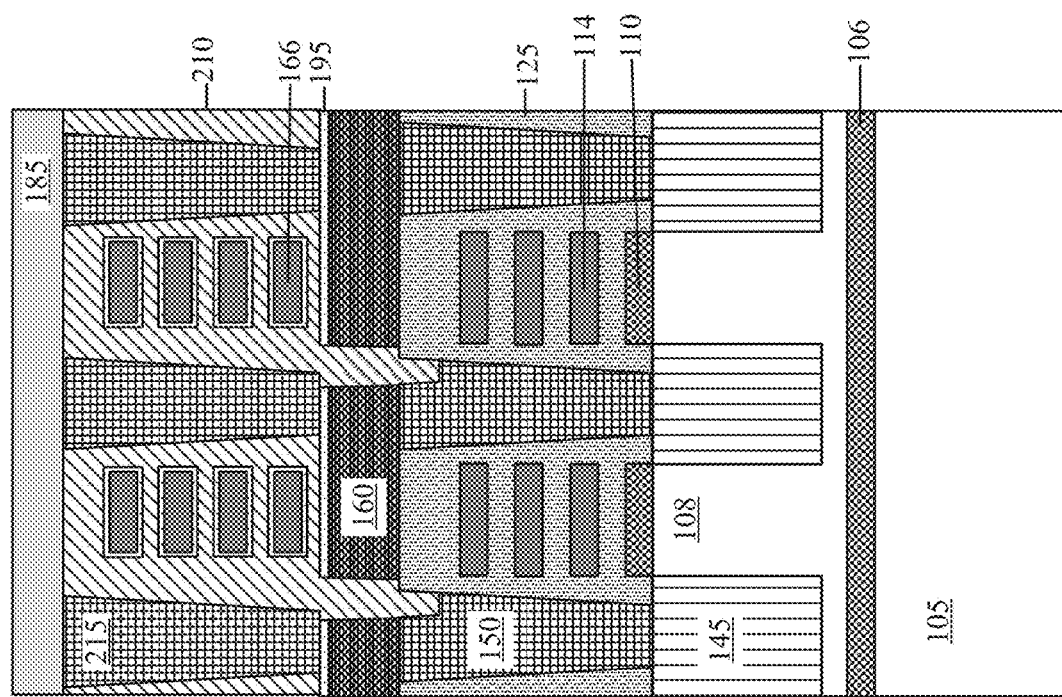
FIG. 24 CROSS-SECTION Y1

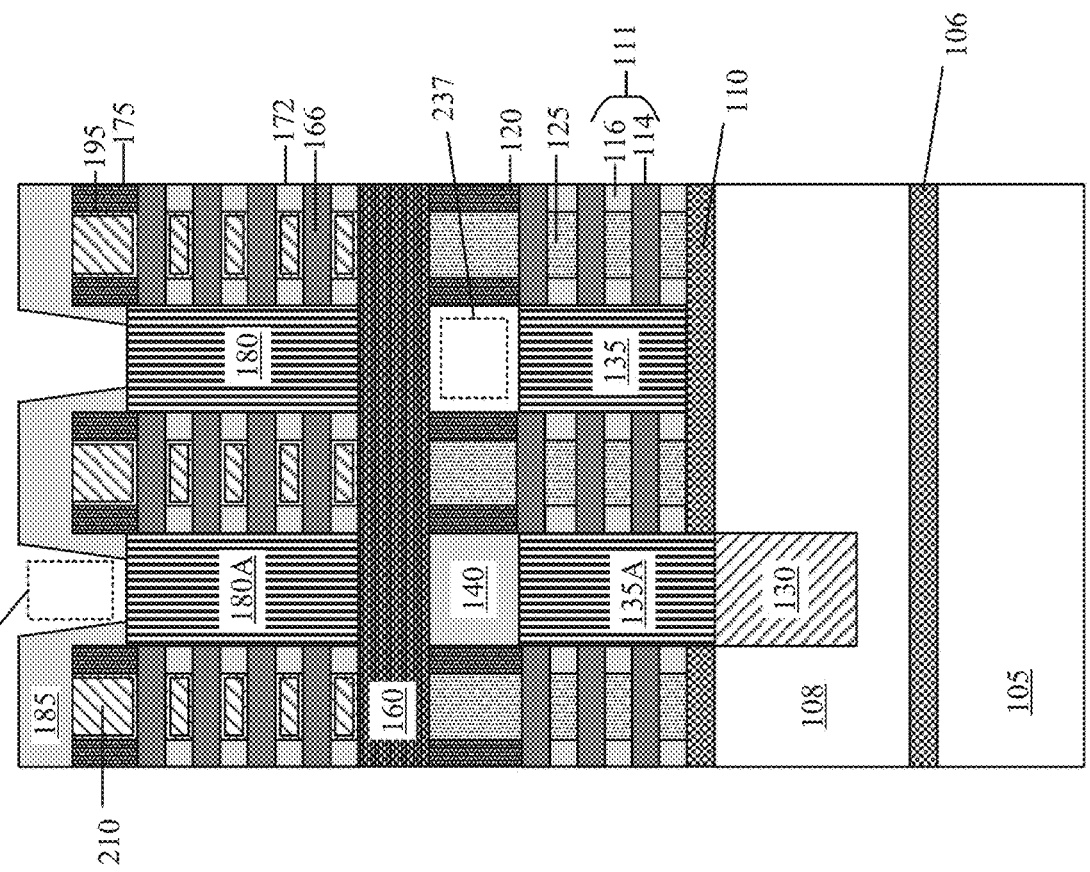

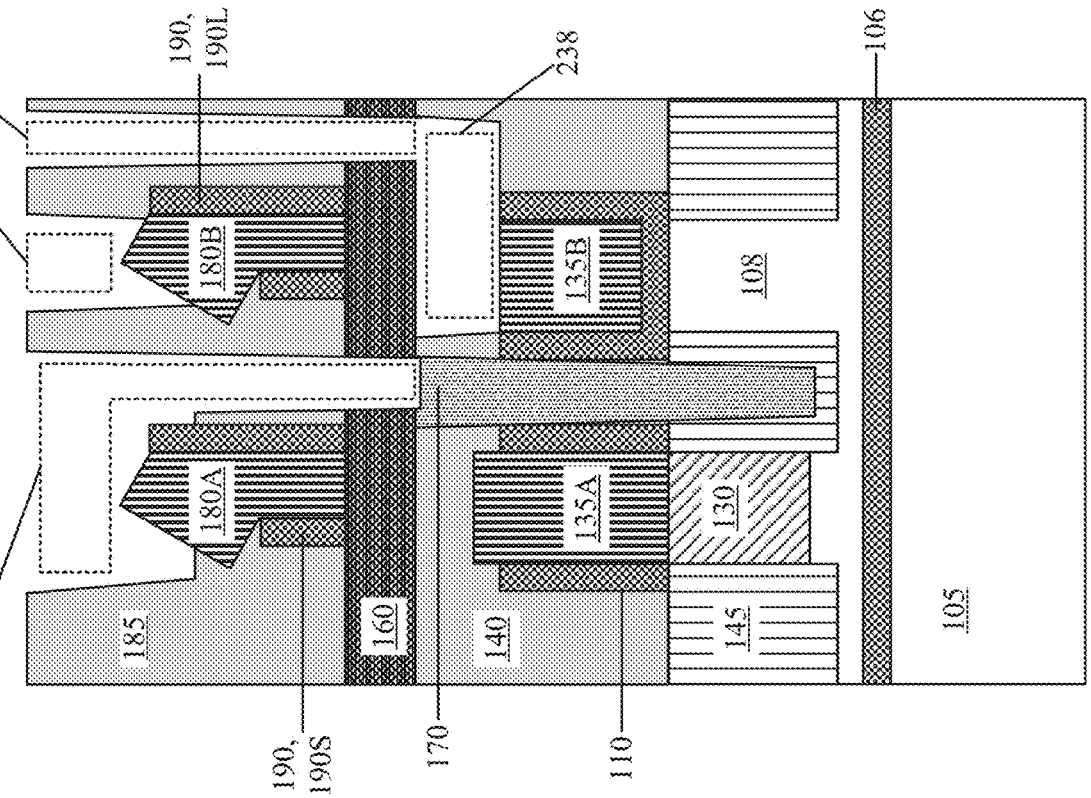
FIG. 28 CROSS-SECTION Y2
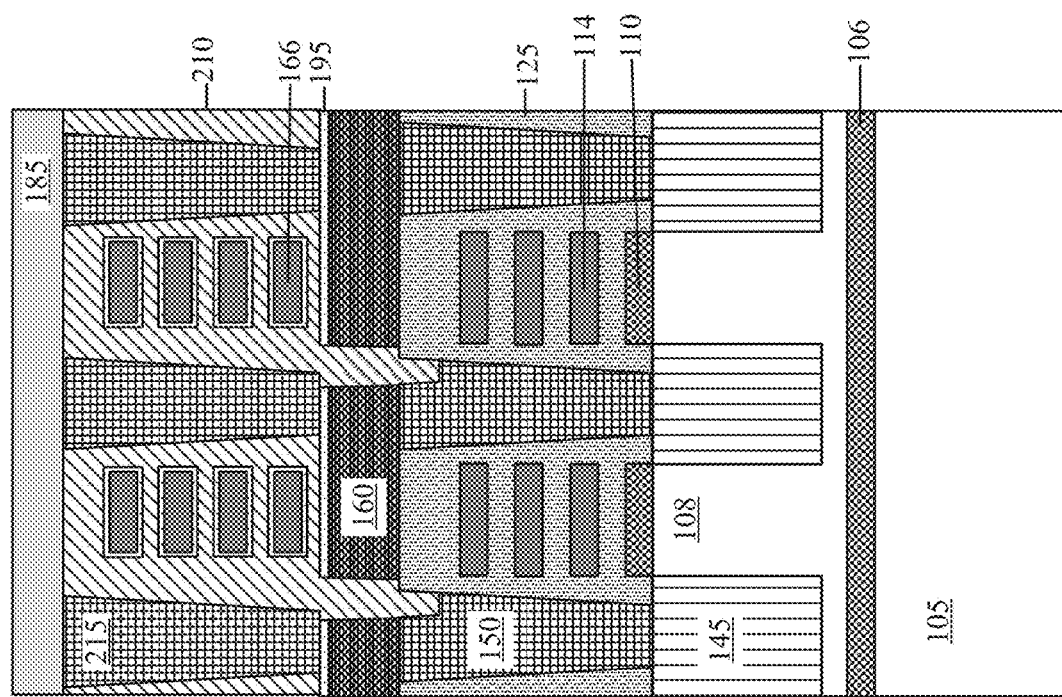
FIG. 27 CROSS-SECTION Y1

CROSS-SECTION X

CROSS-SECTION Y1

CROSS-SECTION Y2

CROSS-SECTION X

CROSS-SECTION Y2

CROSS-SECTION Y1

CROSS-SECTION X

CROSS-SECTION Y2

CROSS-SECTION Y1

CROSS-SECTION X

CROSS- SECTION Y2

CROSS- SECTION Y1

CROSS-SECTION X

CROSS-SECTION Y2

CROSS-SECTION Y1

STACKED FET WITH EXTREMELY SMALL CELL HEIGHT

BACKGROUND

The present invention generally relates to the field of microelectronics, and more particularly to formation of stacked transistors and the formation of the necessary contacts.

Nanosheet is the lead device architecture in continuing CMOS scaling. However, nanosheet technology has shown issues when scaling down such that as the devices become smaller and closer together, they are interfering with each other. Stacking devices allows for an increased device density but forming contacts to the devices is difficult because of the limited space between the devices.

BRIEF SUMMARY

Additional aspects and/or advantages will be set forth in part in the description which follows and, in part, will be apparent from the description, or may be learned by practice of the invention.

A microelectronic structure including a first stacked FET device that includes a first bottom FET device and a first upper FET device. The first bottom FET device include a plurality of first bottom channel layers, and the first upper FET device includes a plurality of first upper channel layers. A bottom gate that surrounds the plurality of first bottom channel layers and an upper gate that surrounds the plurality of first upper channel layers. A gate protrusion that extends downwards from the backside of the upper gate to connected to the bottom gate. The gate protrusion partially overlaps with a bottom gate cut region of the first bottom stacked FET device, and the gate protrusion partially overlaps with an upper gate cut region of the first upper stacked FET device.

A microelectronic structure including a first stacked FET device that includes a first bottom FET device and a first upper FET device. The first bottom FET device include a plurality of first bottom channel layers, and the first upper FET device includes a plurality of first upper channel layers. The first bottom FET device includes a first and second source/drain, and the first upper FET device includes a third and fourth source/drain. The third and fourth source/drain have asymmetric profile. The asymmetric shape of the third and fourth source/drain are comprised of a narrow section and a wide section, respectively. A dielectric liner is located on sidewalls of the third and fourth source/drain, respectively.

A method including the steps of forming a first stacked FET device that includes a first bottom FET device and a first upper FET device. The first bottom FET device include a plurality of first bottom channel layers, and the first upper FET device includes a plurality of first upper channel layers. The first bottom FET device includes a first and second source/drain, and the first upper FET device includes a third and fourth source/drain. Forming a dielectric liner is located on sidewalls of the third and fourth source/drain, respectively. The dielectric liner includes a first vertical segment located on a first side of the third source/drain, and the dielectric liner include a second vertical segment located on a second side of the third source/drain. Forming a second stacked FET device that is located parallel to the first stacked FET device. The second stacked FET device includes a second bottom FET device and second upper FET device, where the second bottom FET device include a plurality of second bottom channel layers and the second upper FET device includes a plurality of second upper channel layer. The second bottom FET device includes a fifth source/drain and the second upper FET device includes a sixth source/drain. Forming a first source/drain contact connected to the backside surface of the first source/drain. Forming a second source/drain contact connected to the third source/drain, where the second source/drain contact is comprised of a first section and a second section. The first section is connected a top surface and a sidewall of the third source/drain, wherein the second section is a via that extends to the backside of stacked FET device. Forming a third source/drain contact that is connected to the eighth source/drain, where the third source/drain is comprised of a third section and a fourth section. The third section is a via that extends from the second upper device towards the second bottom device and the fourth section extends horizontally from the third section across a top surface of the fifth source/drain.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 9 illustrates a cross section Y1 of the gate region after the patterning of the upper nano layers, dummy gate formation, upper inner spacer formation, top upper spacer formation, upper source/drain formation, and the formation of the second interlayer dielectric layer, in accordance with the embodiment of the present invention.

FIG. 10 illustrates a cross section Y2 of the source/drain region after the patterning of the upper nano layers, dummy gate formation, upper inner spacer formation, top upper spacer formation, upper source/drain formation, and the formation of the second interlayer dielectric layer, in accordance with the embodiment of the present invention.

FIG. 24 illustrates a cross section Y1 of the gate region after the formation of additional second interlayer dielectric and the formation of contact trenches, in accordance with the embodiment of the present invention.

FIG. 25 illustrates a cross section Y2 of the source/drain region after the formation of additional second interlayer dielectric and the formation of contact trenches, in accordance with the embodiment of the present invention.

FIG. 26 illustrates a cross section X of the nano stack after the removal of the second placeholder, in accordance with the embodiment of the present invention.

FIG. 27 illustrates a cross section Y1 of the gate region after the removal of the second placeholder, in accordance with the embodiment of the present invention.

FIG. 28 illustrates a cross section Y2 of the source/drain region after the removal of the second placeholder, in accordance with the embodiment of the present invention.

DETAILED DESCRIPTION

Figure 1:
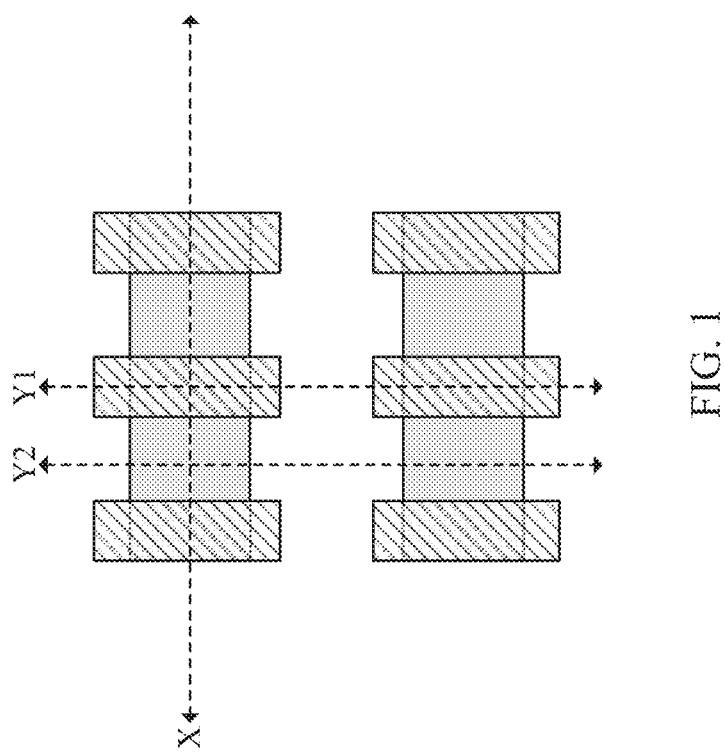
FIG. 1 illustrates a top-down view of multiple nano devices, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semi-conductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards the formation of stacked devices. The width of the nanosheets of the upper devices are narrower than the width of the nanosheets of the lower devices. The narrow widths of the upper devices provide space for the formation of contacts to the lower devices. However, the narrowing of the space for the upper devices causes the upper source/drain to be narrower, which limits the amount of available surface area for connecting to a source/drain contact. By blowing out one of the spacer/liner sidewalls prior to the formation of the source/drain, will allow the source/drain to expand in the direction of the blow-out. This causes an increase of the surface area of the source/drain that is available for forming a connection to a source/drain contact.

FIG. 1 illustrates a top-down view of multiple devices, in accordance with the embodiment of the present invention. The cross-section X extends horizontally through the nano stacks of one of the stacked devices. Cross section $Y_1$ is perpendicular to cross section X, where cross section $Y_1$ is through a gate region that spans across multiple nano stacks. Cross section $Y_2$ is perpendicular to cross section X, where cross section $Y_2$ is through the source/drain region of multiple nano stacks.

Figure 2:
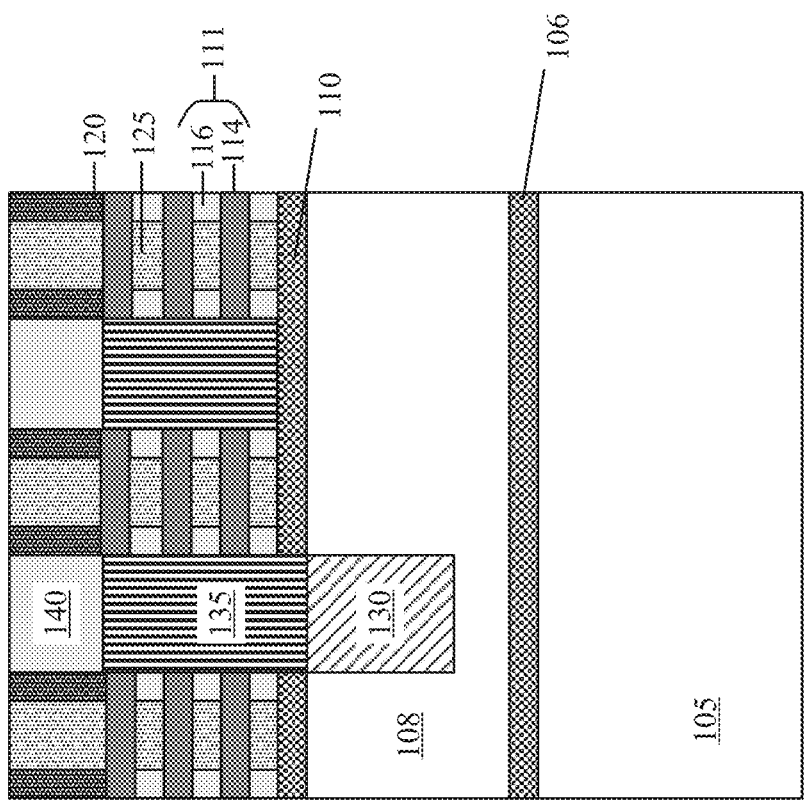
FIG. 2 illustrates a cross section X of the nano stack after the formation of the bottom devices, in accordance with the embodiment of the present invention.
Figure 3:
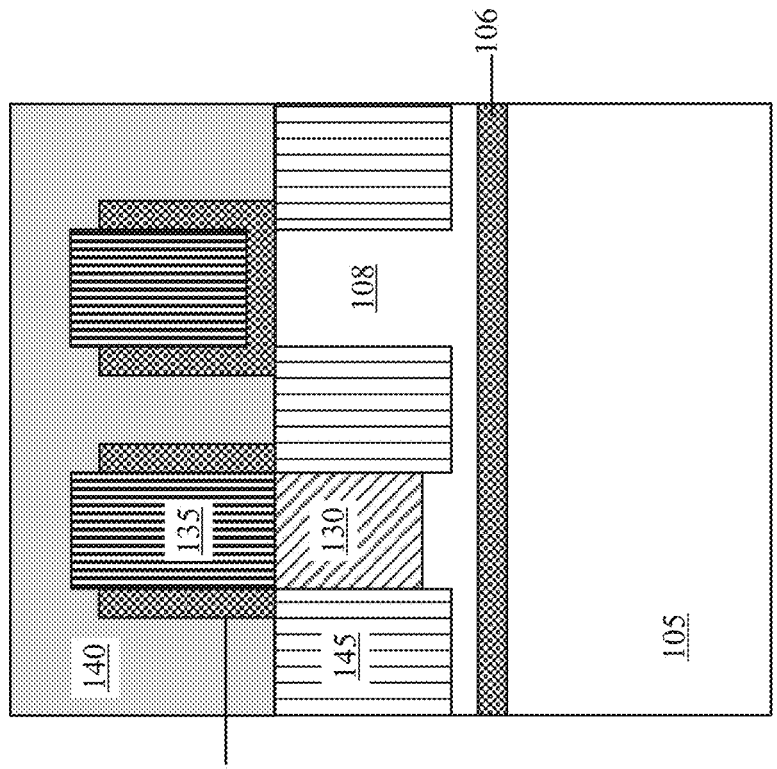
FIG. 3 illustrates a cross section Y1 of the gate region after the formation of the bottom device, in accordance with the embodiment of the present invention.
Figure 4:
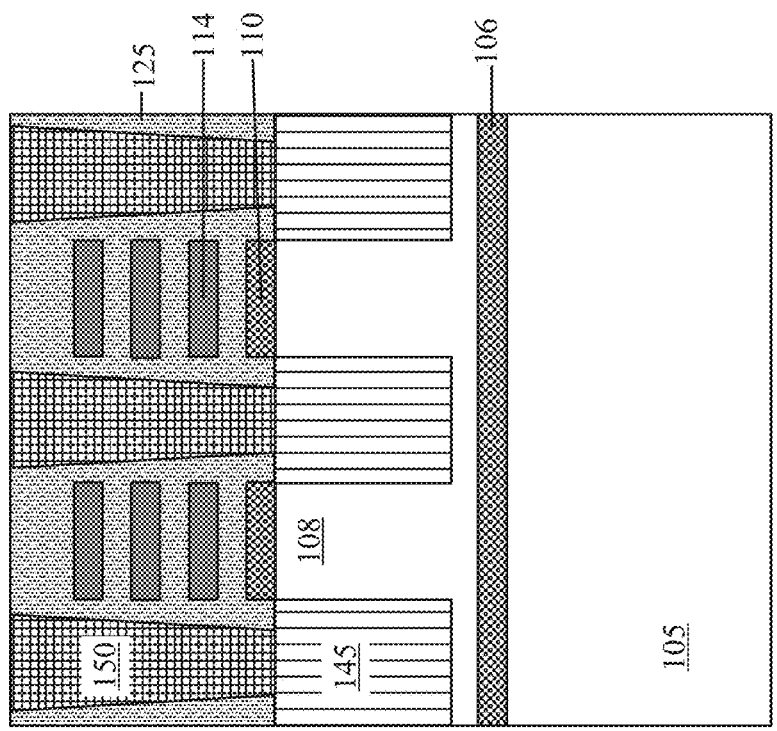
FIG. 4 illustrates a cross section Y2 of the source/drain region after formation of the bottom device, in accordance with the embodiment of the present invention.

FIGS. 2, 3, and 4 illustrate the processing stage after the formation of bottom devices. The bottom devices include a first substrate 105, an etch stop 106, a second substrate 108, a first placeholder 130, a bottom dielectric isolation (BDI) layer 110, a plurality of channel layers 114, inner spacer 116, an upper spacer 120, a gate 125, bottom source/drains 135, and a first interlayer dielectric layer 140.

The first substrate 105 and the second substrate 108 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the first substrate 105 and the second substrate 108. In some embodiments, the first substrate 105 and the second substrate 108 includes both semiconductor materials and dielectric materials. The semiconductor first substrate 105 and the second substrate 108 may also comprise an organic semiconductor or a layered semiconductor such as, for example, Si/SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein.

The inner spacer 116 is located adjacent to the gate 125 and located above/below the channel layers 114. The plurality of channel layers 114 can be comprised of, for example, Si. The gate 125 is located around each of the channel layers 114 and located between sections of the upper spacer 120. The gate 125 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W.

The gate region is composed of the gate 125, the plurality of channels layers 114, the inner spacer 116, the upper spacer 120, and the BDI layer 110. FIG. 2 illustrates a plurality of gate regions (columns). A source/drain 135 is located between each of the gate regions, where the source/drain 135 can be located on top of the BDI layer 110 or the source/drain 135 can be located on top of the first placeholder 130. The first placeholder 130 extends downwards into the second substrate 108. The first interlayer dielectric layer 140 is located on top of the source/drain 135.

The source/drain 135 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIG. 3 illustrates a cross section across the gate region. During the etching of the nano devices, a portion of the second substrate 108 is removed. These sections are filled in with a shallow trench isolation layer 145. The gate 125 surrounds each of the channel layers 114. A plurality of bottom gate cuts 150 are formed in the gate 125. The bottom gate cuts 150 are formed over the shallow trench isolation layer 145. The bottom gate cuts 150 separate the gate 125 into a plurality of different bottom devices. FIG. 4 illustrates a cross section across the source/drain region. Portions of the BDI layer 145 are formed as vertical segments and are utilized as a frame to contain the source/drain 135. The BDI layer 110 can extend under the source/drain 135 or the bottom section of the BDI layer 110 is removed during the formation of the first placeholder 130.

Figure 5:
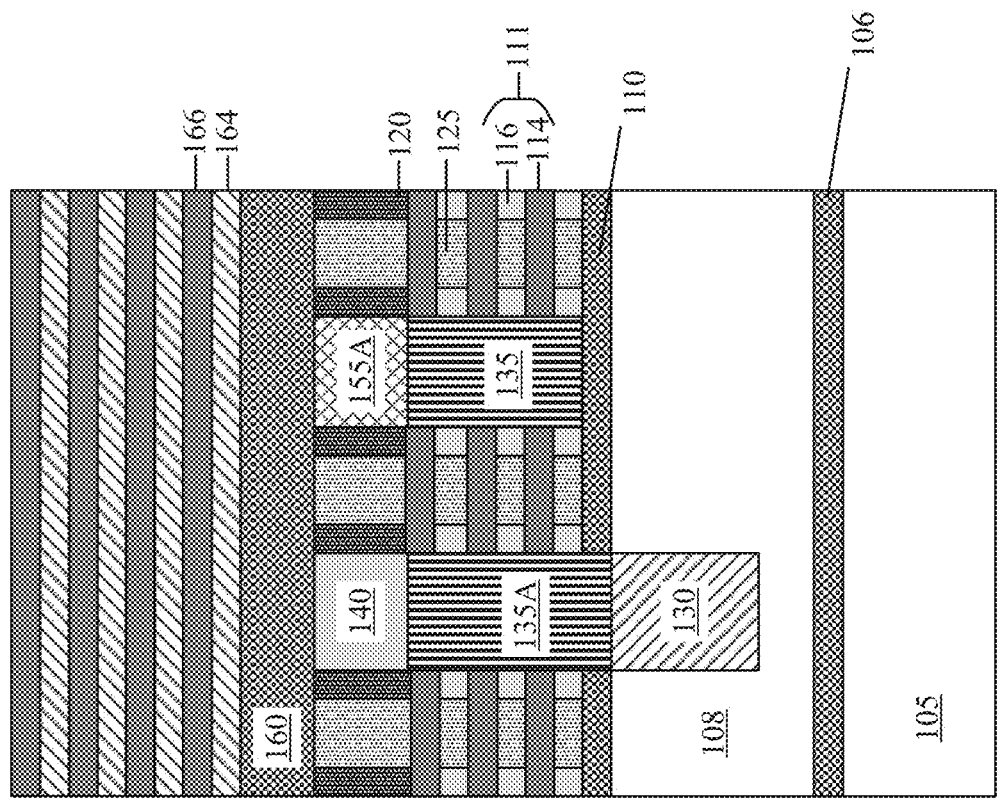
FIG. 5 illustrates a cross section X of the nano stack after the formation of a second placeholder and the formation of the upper nano layers, in accordance with the embodiment of the present invention.
Figure 6:
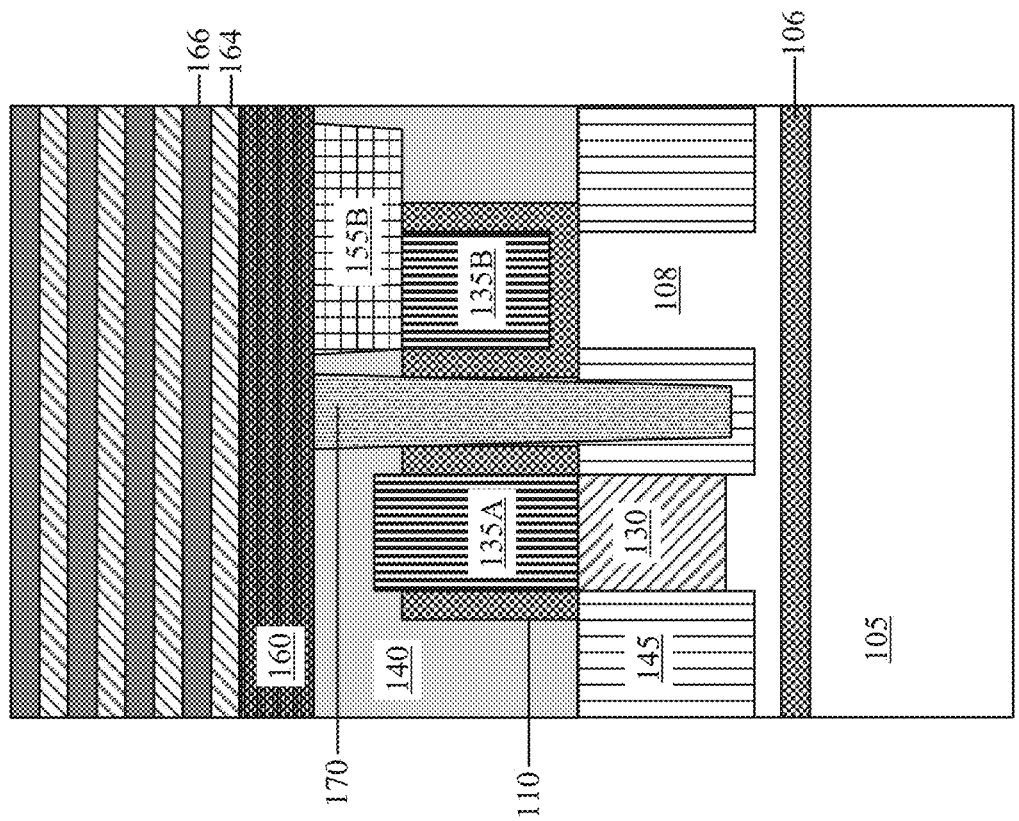
FIG. 6 illustrates a cross section Y1 of the gate region after the formation of a second placeholder and the formation of the upper nano layers, in accordance with the embodiment of the present invention.
Figure 7:
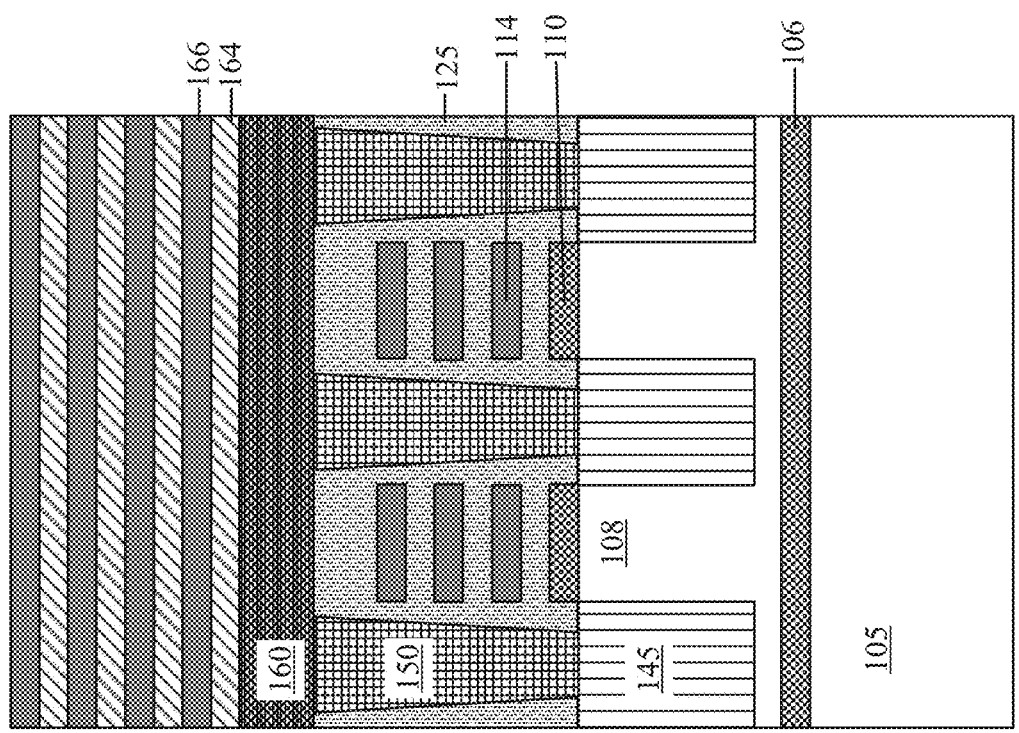
FIG. 7 illustrates a cross section Y2 of the source/drain region after formation of a second placeholder and the formation of the upper nano layers, in accordance with the embodiment of the present invention.

FIGS. 5, 6, and 7 illustrate the processing stage after the formation of a second placeholder and the formation of the upper nano layers. Portions of the first interlayer dielectric layer 140 are removed to create trenches (not shown). These trenches are filled in with a sacrificial material, for example, $TiO_x$, $AlO_x$, etc., to form the second placeholders 155A, 155B. As illustrated in FIG. 7 a backside via contact 170 is formed by creating a trench (not shown) in the first interlayer dielectric layer 140 and the shallow trench isolation layer 145 and filling that trench in with a conductive metal, for example, Ru, Co, or W. The backside via contact 170 extends downwards between the bottom source/drain 135A and the bottom source/drain 135B, such that the backside via contact 170 extends downwards into the shallow trench isolation layer 145. The backside via contact 170 can be in contact with the vertical segments of the BDI layer 110, or portions of the first interlayer dielectric layer 140 can be located between the backside via contact 170 and the vertical segments of the BDI layer 110.

Half of a bonding oxide 160 is formed on top of the upper spacer 120, the gate 125, the first interlayer dielectric layer 140, the second placeholder 155A, 155B, the bottom gate cuts 150, and the backside via contact 170. The other half of the bonding oxide is formed over another substrate comprising alternative Si/SiGe epi stack over a Si substrate (not shown). After that, the two wafers are bonded by oxide-oxide bonding process. After wafer bonding, the Si substrate of the top wafer is removed. Thus, the upper nano layers are formed on top of the bonding oxide 160. The upper nano layers include alternating layers of sacrificial layers 164 and upper channel layers 166. The sacrificial layers 164 can be comprised of SiGe, where Ge is in the range of about 15% to 35%. The upper channel layers 166 can be comprised of, for example, Si.

Figure 8:
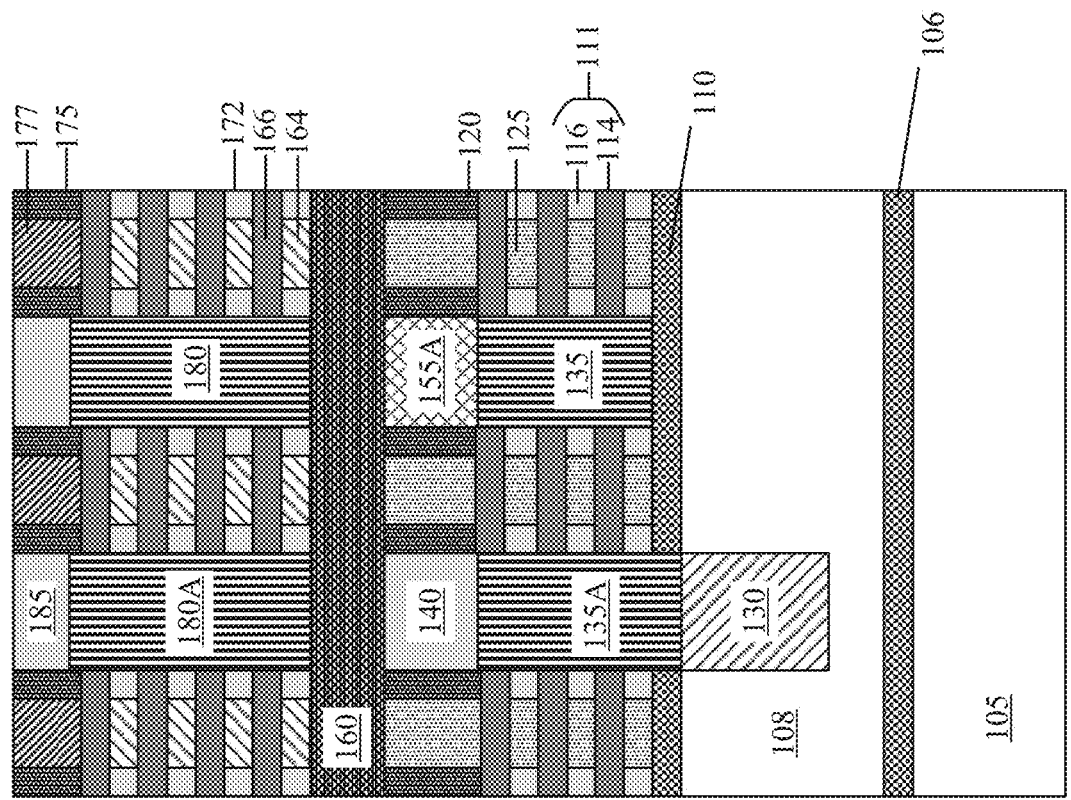
FIG. 8 illustrates a cross section X of the nano stack after the patterning of the upper nano layers, dummy gate formation, upper inner spacer formation, top upper spacer formation, upper source/drain formation, and the formation of the second interlayer dielectric layer, in accordance with the embodiment of the present invention.

FIGS. 8, 9, and 10 illustrate the processing stage after the patterning of the upper nano layers, formation of a dummy gate 177, an upper inner spacer 172, top upper spacer 175, an upper source/drain 180, 180A, 180B, and the formation of the second interlayer dielectric layer 185. The upper nano layers are patterned to form a plurality of nano columns (gate regions) as illustrated by FIG. 8. The upper channel layers 166 have a narrower width when compared to the channel layers 114 of the bottom devices as shown in FIG. 9. The narrower width of the upper channel layer 166 allows for the formation of a shared gate and source/drain contacts. The sacrificial layers 164 are recessed back to create space for the formation of the upper inner spacer 172. The top upper spacer 175 is formed on top of an upper channel layer 166, and the dummy gate 177 is formed between sections of the top upper spacer 175 and located on top of the upper channel layer 166.

The upper source/drains 180, 180A, 180B are formed between the nano columns. The upper source/drains 180, 180A, 180B can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. A second interlayer dielectric layer 185 is formed on top of the upper source/drains 180, 180A, 180B.

As illustrated by FIG. 9, the dummy gate 177 surrounds three sides of the nano stack columns. The dummy gate 177 is formed on top of the bonding oxide 160. As illustrated in FIG. 10, a source/drain liner 190 is formed to contain the upper source/drain 180, 180A, 180B, where the source/drain liner 190 allows for the asymmetric formation of the upper source/drain 180, 180A, 180B. The source/drain liner 190 allows for the formation of a narrow section and a wide section of the upper source/drain 180, 180A, 180B, respectively. One of the source/drain liner 190 is pulled down (blown out) to make a short source/drain liner 190S and a long source/drain liner 190L. The long source/drain liner 190L and the short source/drain liner 190S have different vertical heights, such that, the vertical height of the long source/drain liner 190L is greater than the vertical height of the short source/drain liner 190S. During the formation of the upper source/drain 180, 180A, 180, the short source/drain liner 190S allows for the horizontal expansion of the upper source/drain 180, 180A, 180B over the short source/drain liner 190S. This horizontal expansion of the upper source/drain 180, 180A, 180B increases the surface area of the upper source/drain 180, 180A, 180B for forming a connection with a contact. The portion of the upper source/drain 180, 180A, 180B that is sandwiched between the short source/drain liner 190S and the long source/drain liner 190L has a first width. The upper source/drain 180, 180A, 180B that is located adjacent to the long source/drain liner 190L and above the short source/drain liner 190S has a second width, where the second width is larger than the first width. As seen in FIG. 10, the second interlayer dielectric layer 185 is formed on top of the bonding oxide 160, and around the source/drain liner 190 and the upper source/drain 180, 180A, 180B.

Figure 11:
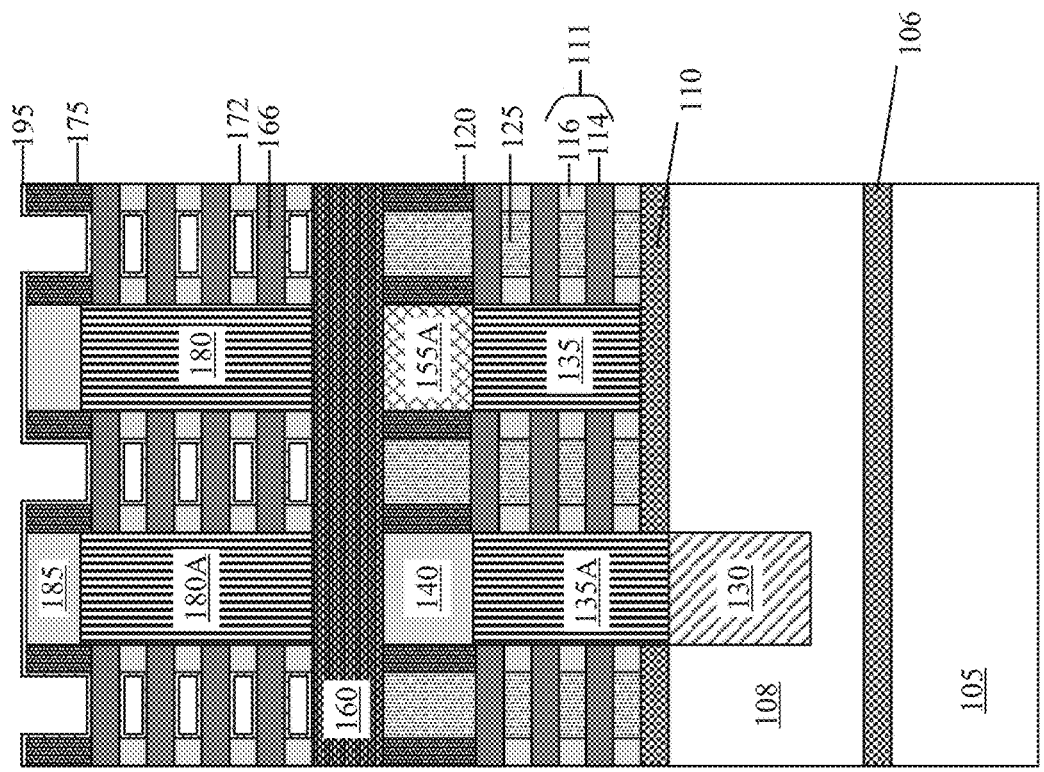
FIG. 11 illustrates a cross section X of the nano stack after the removal of the sacrificial layers and the dummy gate, and the formation of a dielectric liner, in accordance with the embodiment of the present invention.
Figure 13:
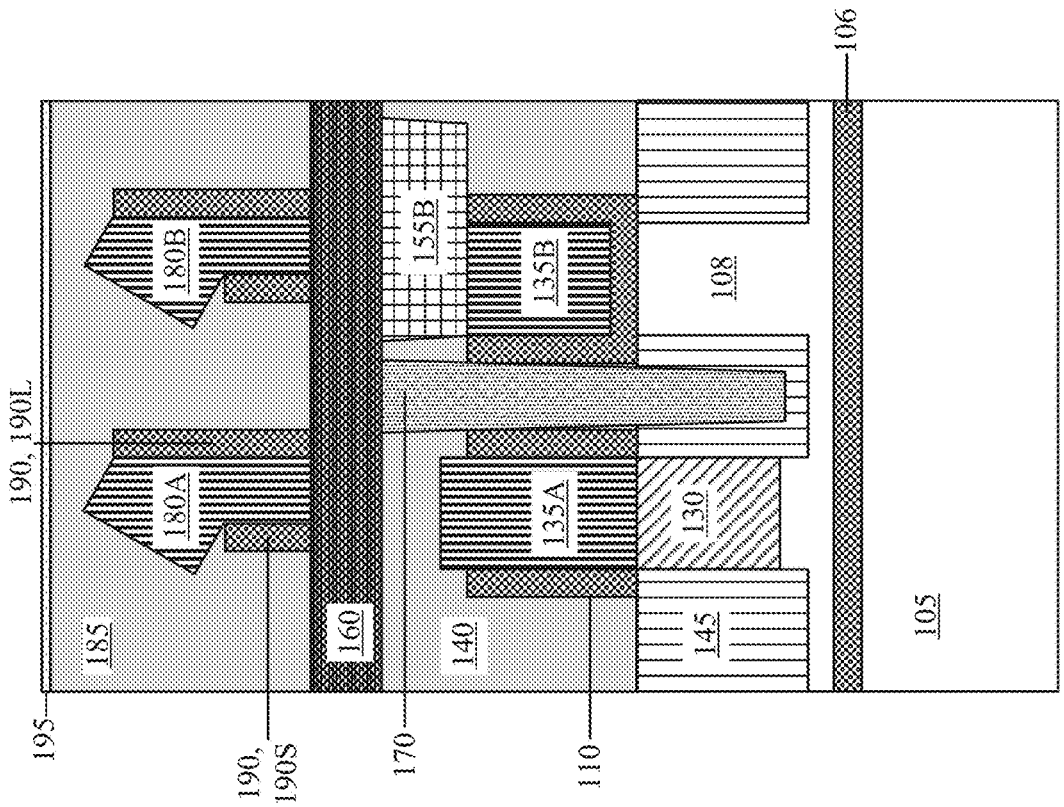
FIG. 13 illustrates a cross section Y2 of the source/drain region after the removal of the sacrificial layers and the dummy gate, and the formation of a dielectric liner, in accordance with the embodiment of the present invention.
Figure 12:
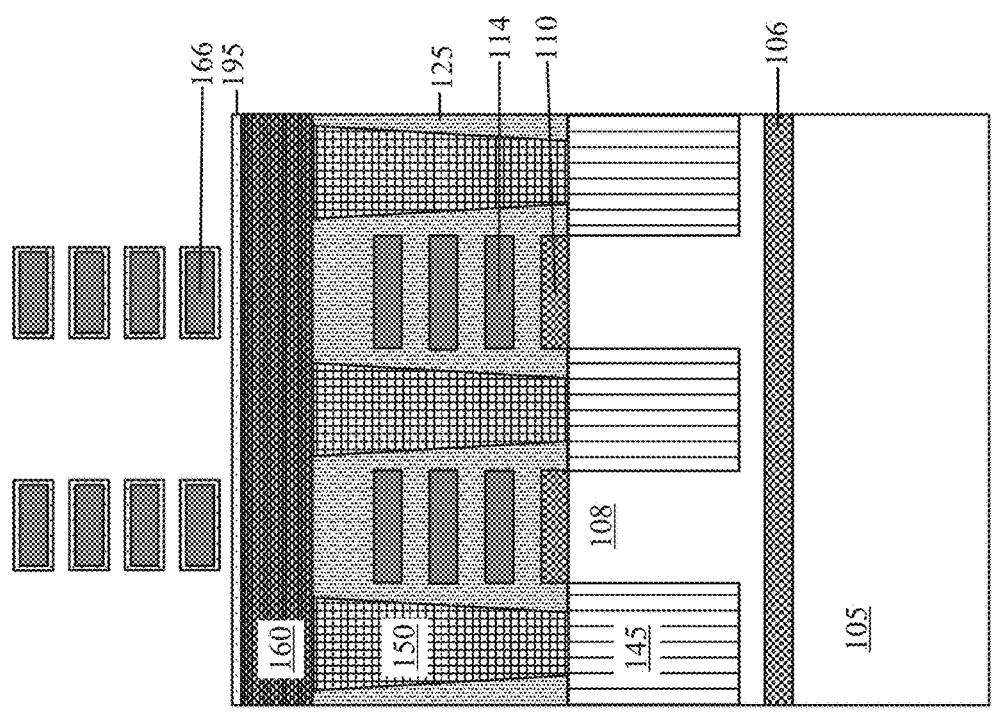
FIG. 12 illustrates a cross section Y1 of the gate region after the removal of the sacrificial layers and the dummy gate, and the formation of a dielectric liner, in accordance with the embodiment of the present invention.

FIGS. 11, 12, and 13 illustrate the processing stage after the removal of the sacrificial layers and the dummy gate, and the formation of a gate dielectric liner 195. The sacrificial layers 164 and the dummy gate 177 are removed. A gate dielectric liner 195 is formed on the exposed surface of the different layers. The gate dielectric liner 195 can be comprised of, for example, a high-k dielectrics, such as $HfO_2$, $ZrO_2$. $HfAlO_x$, $HfL_aO_x$, etc.

Figure 14:
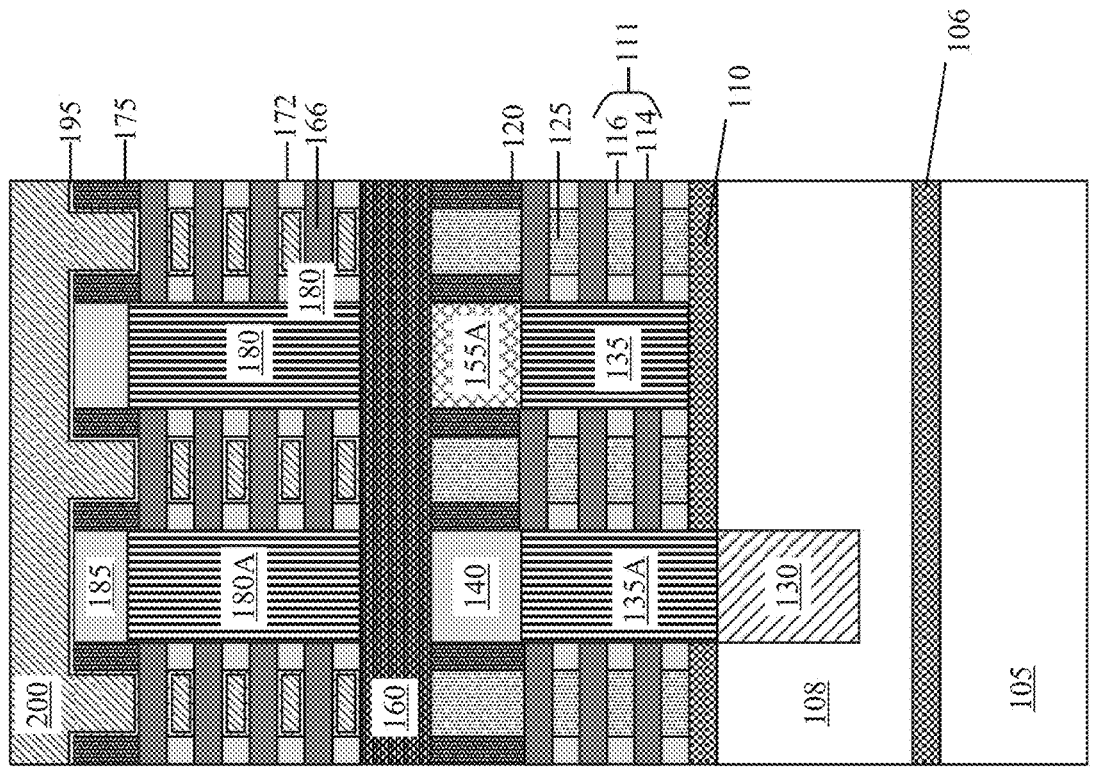
FIG. 14 illustrates a cross section X of the nano stack after formation of an upper sacrificial layer and the formation of a gate trench, in accordance with the embodiment of the present invention.
Figure 16:
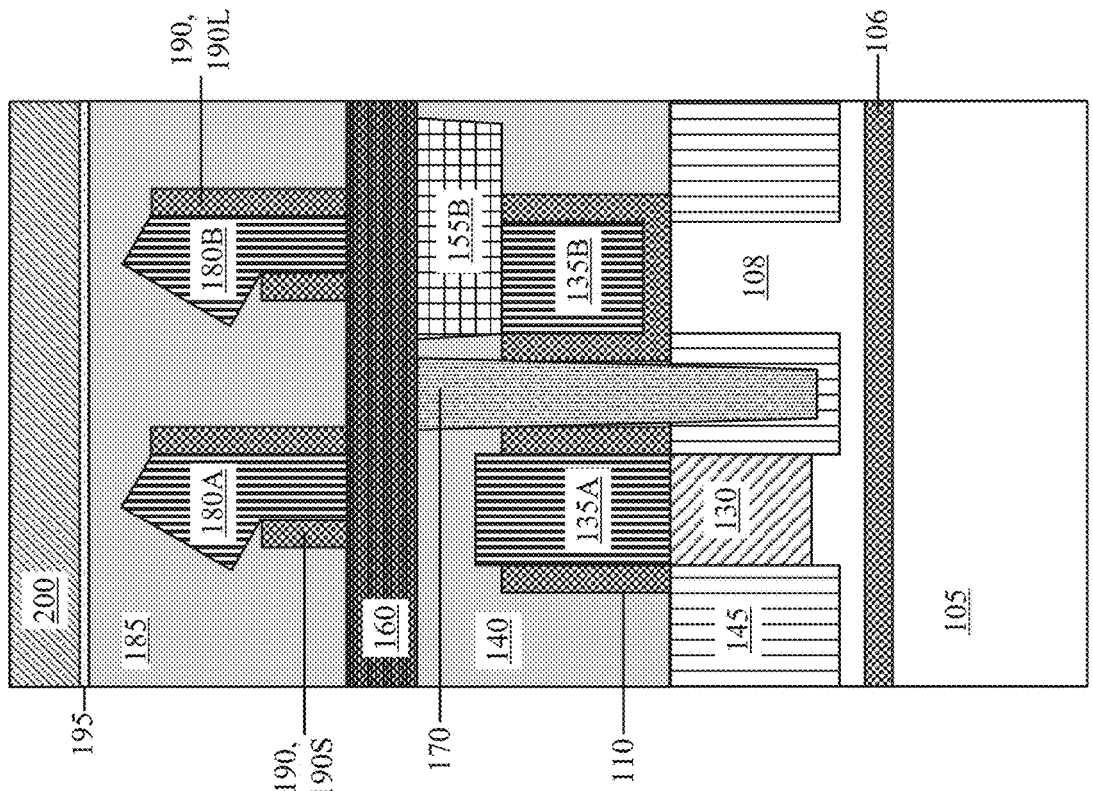
FIG. 16 illustrates a cross section Y2 of the source/drain region after formation of an upper sacrificial layer and the formation of a gate trench, in accordance with the embodiment of the present invention.
Figure 15:
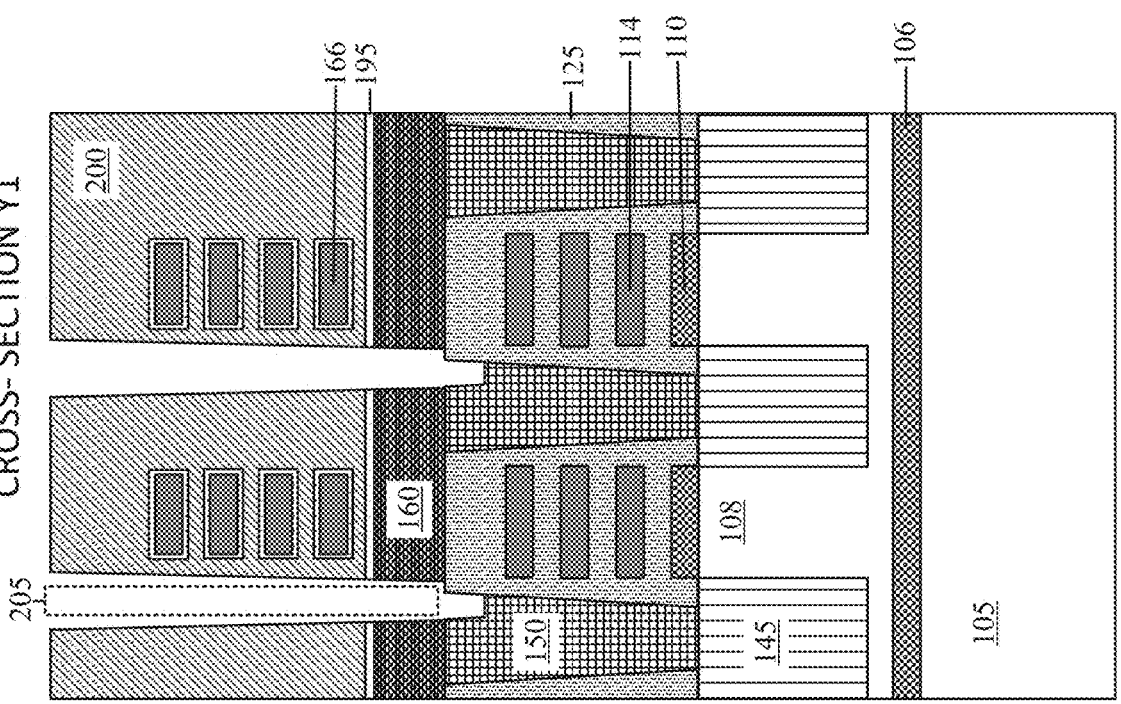
FIG. 15 illustrates a cross section Y1 of the gate region after formation of an upper sacrificial layer and the formation of a gate trench, in accordance with the embodiment of the present invention.

FIGS. 14, 15, and 16 illustrate the processing stage after formation of an upper sacrificial layer 200 and the formation of a gate trench 205. An upper sacrificial layer 200 comprised of, for example, TiN/a-Si, is formed on the exposed surfaces as illustrated in the figures. A gate trench 205 is formed in the upper sacrificial layer 200, the dielectric liner 195, the bonding oxide 160, and the bottom gate cut 150. The gate trench 205 allows for the formation of a shared gate between the gate 125 located around a bottom device and an upper gate (which will be described in further detail below). The gate trench 205 exposes a portion of the top surface of the gate 125 and a portion of the sidewall of the gate 125. The gate trench 205 exposes a portion of the sidewall of the gate 125 because the gate trench 205 removes a portion of the bottom gate cut 150. The width of the upper channels 166 is smaller than the width of the channel layer 114, the smaller width of the upper channels 166 leaves room for the formation of the gate trench 205.

Figure 17:
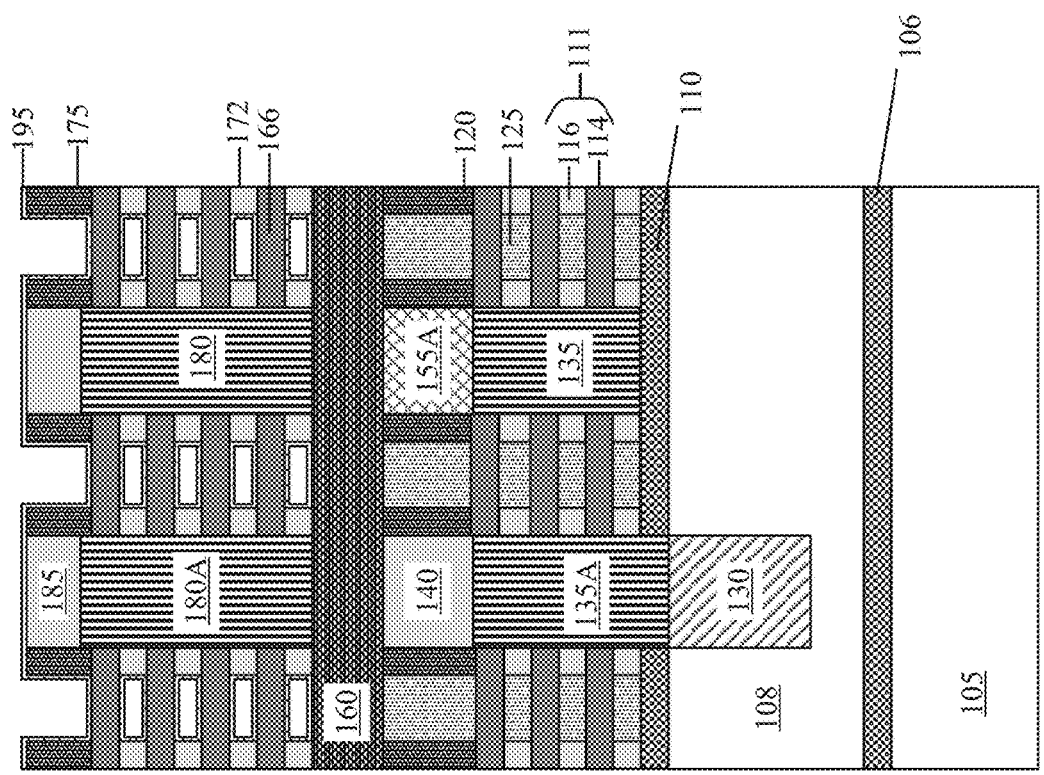
FIG. 17 illustrates a cross section X of the nano stack after the removal of the upper sacrificial layer, in accordance with the embodiment of the present invention.
Figure 18:
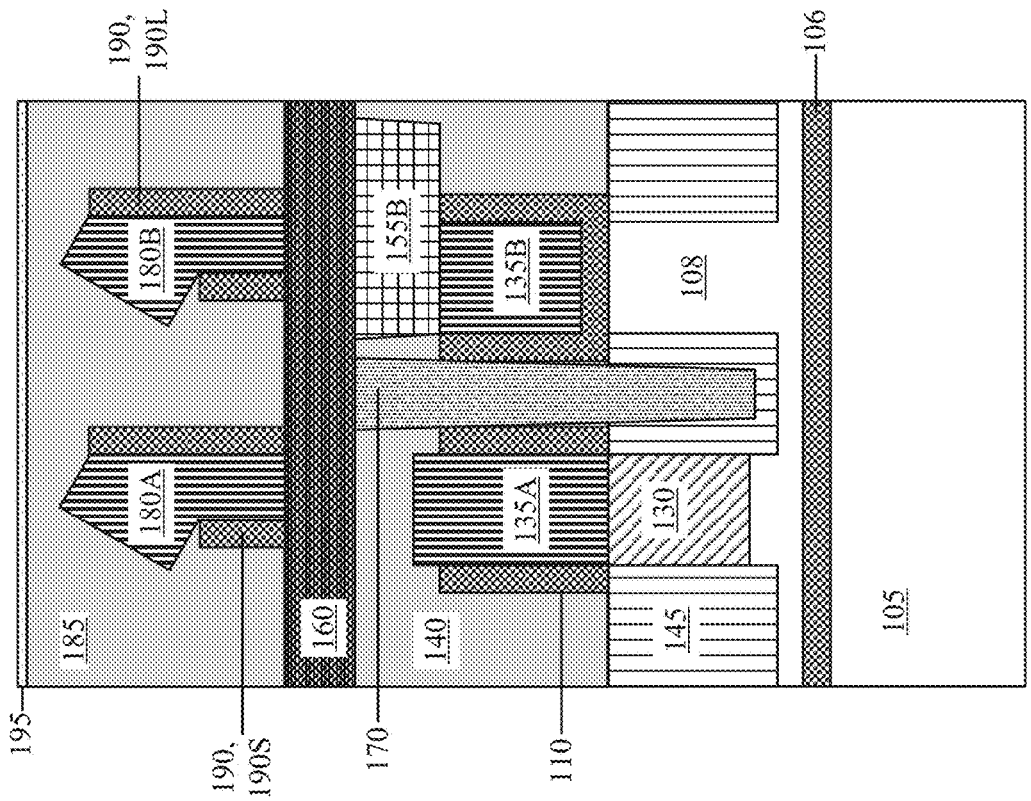
FIG. 18 illustrates a cross section Y1 of the gate region after the removal of the upper sacrificial layer, in accordance with the embodiment of the present invention.
Figure 19:
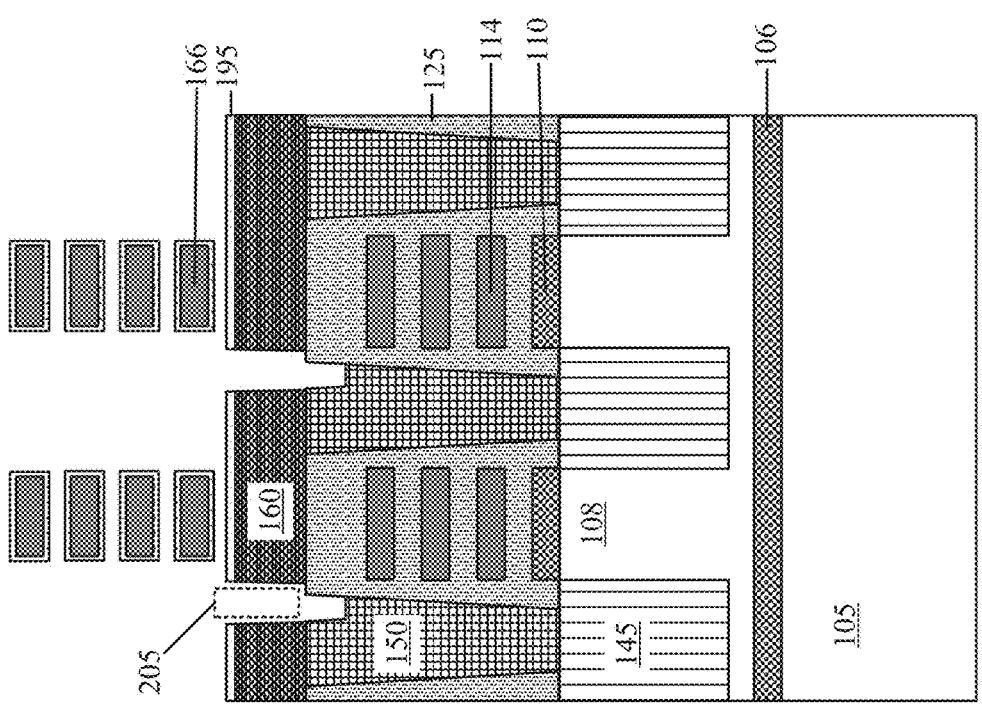
FIG. 19 illustrates a cross section Y2 of the source/drain region after the removal of the upper sacrificial layer, in accordance with the embodiment of the present invention.

FIGS. 17, 18, and 19 illustrate the processing stage after the removal of the upper sacrificial layer 200. The upper sacrificial layer 200 is removed, which exposes the dielectric liner 195. A portion of the gate trench 205 remains in the bonding oxide 160 and the bottom gate cut 150. The gate trench 205 makes a pathway connecting the gate 125 and the space surrounding the upper device. When gate material is added to the upper device, then the gate trench 205 will be filled in with the gate material to connect the gate 125 with the gate of the upper device (which will be described in detail below).

Figure 20:
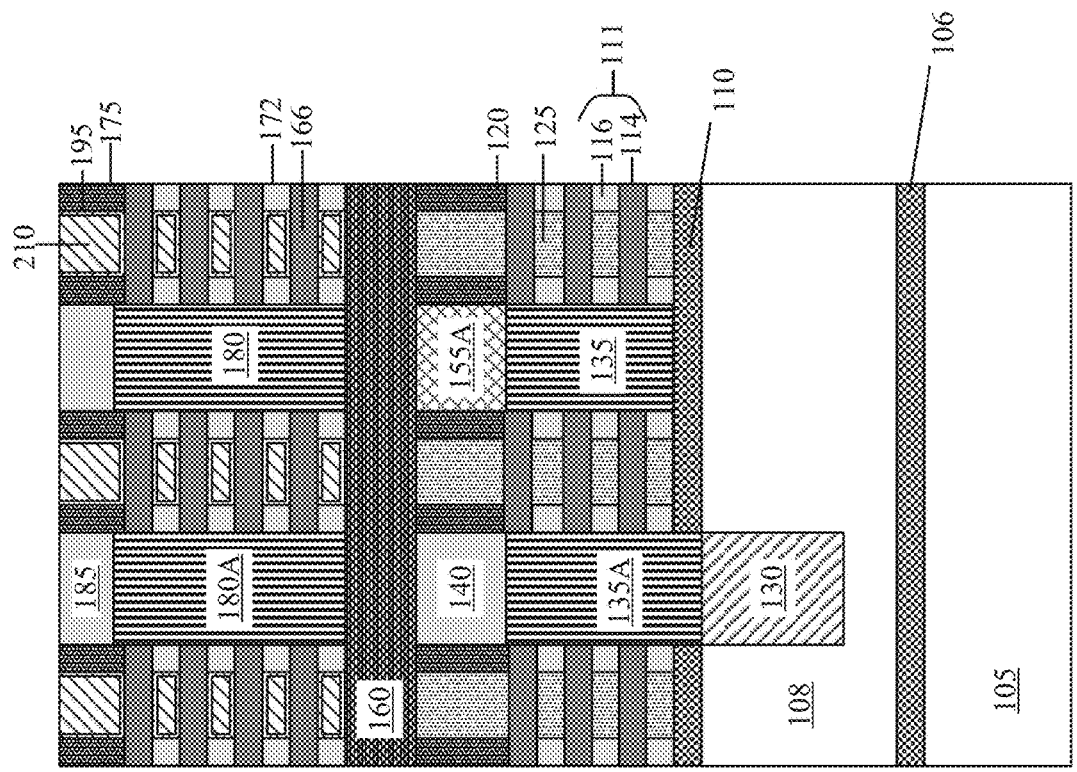
FIG. 20 illustrates a cross section X of the nano stack after the formation of the upper gate and the upper gate cuts, in accordance with the embodiment of the present invention.
Figure 21:
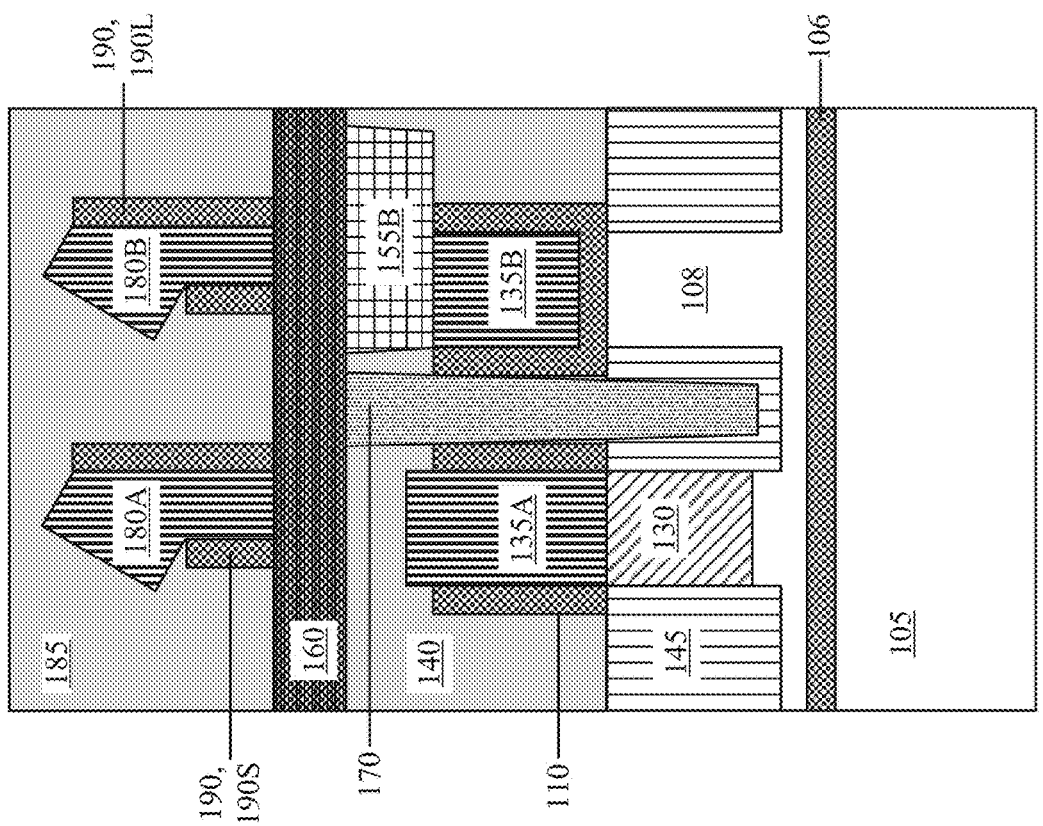
FIG. 21 illustrates a cross section Y1 of the gate region after the formation of the upper gate and the upper gate cuts, in accordance with the embodiment of the present invention.
Figure 22:
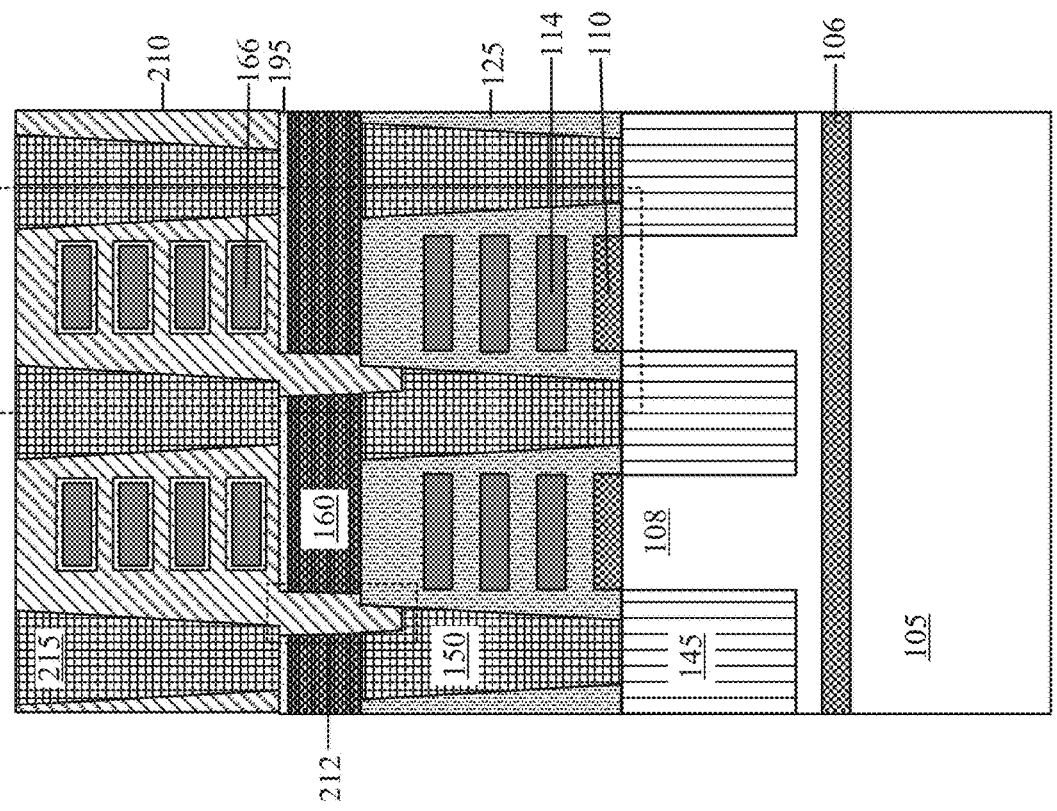
FIG. 22 illustrates a cross section Y2 of the source/drain region after the formation of the upper gate and the upper gate cuts, in accordance with the embodiment of the present invention.

FIGS. 20, 21, and 22 illustrate the processing stage after the formation of the upper gate 210 and the upper gate cuts 215. The upper channels 166 and the dielectric liner 195 are surrounded by the upper gate 210. The material of upper gate 210 (e.g., to form a protrusion) fills in the gate trench 205 so that the upper gate 210 is in direct contact with a top surface and a sidewall of the gate 125 of one of the bottom devices, as emphasized by dashed box 212. The upper gate 210 can be comprised of, for example, work function layers, such as TiN, TiAlC, TiC, etc., and conductive metal fills, like W. Trenches (not shown) are formed in the upper gate 210, where the trenches are located above the dielectric liner 195 and the bonding oxide 160. A portion of the trenches can extend over a portion of the location where gate trench 205 was located. The trenches are filled in with a dielectric material to form the upper gate cuts 215. The upper gate cuts 215 separate the upper nano stacks (gate regions) into a plurality of different upper devices (gate regions). Dashed box 212 emphasizes the section of the upper gate 210 (e.g., the protrusion) located around one of the upper devices, where the protrusion is connected to a sidewall and a frontside surface of the gate 125 located around one of the bottom devices. Dashed box 213 emphasizes a shared gate device because the upper gate 210 of the upper device is connected to the gate 125 of the bottom devices via the connection (as emphasized by dashed box 212) through the bonding oxide 160.

Figure 23:
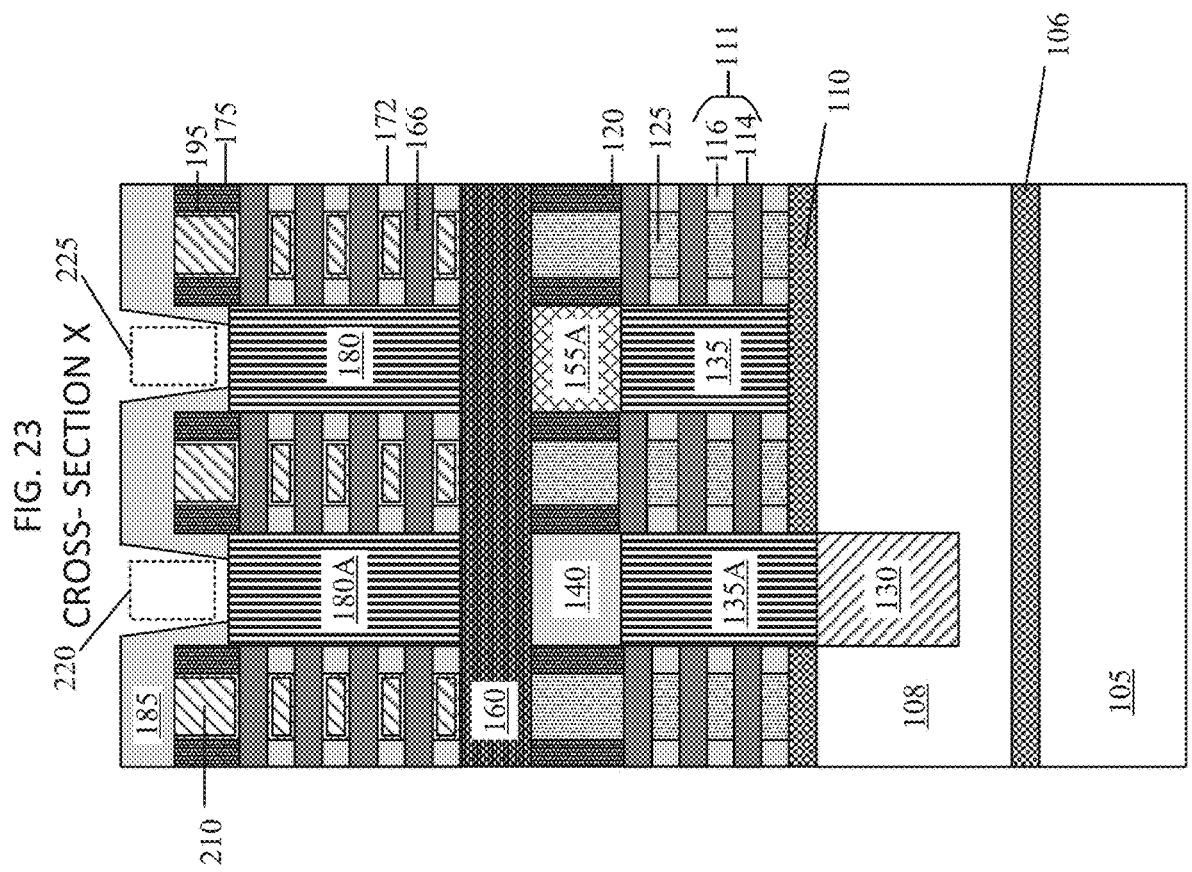
FIG. 23 illustrates a cross section X of the nano stack after the formation of additional second interlayer dielectric and the formation of contact trenches, in accordance with the embodiment of the present invention.

FIGS. 23, 24, and 25 illustrate the processing stage after the formation of additional second interlayer dielectric layer 185 and the formation of contact trenches, 220, 225, 230, and 235. Additional second interlayer dielectric layer material is formed on top of the upper gate 210, on top of the upper gate cuts 215, on top of the top upper spacer 175, and on top of the second interlayer dielectric layer 185. A plurality of different contact trenches is formed in a plurality of different layers to exposed different elements. As illustrated in FIG. 23, a first contact trench 220 and a second contact trench 225 are formed in the second interlayer dielectric layer 185 to expose a top surface of the upper source/drain 180A and a top surface of the upper source/drain 180. FIG. 25 illustrates the first contact trench 220, a third contact trench 230, and a fourth contact trench 235. The first contact trench 220 has two sections, where the first section exposes a top surface and side surfaces of the upper source/drain 180A. The first contact trench 220 also exposes a portion of the long source/drain liner 190L. The blown-out section of the upper source/drain 180A allows for more surface area of the upper source/drain 180A to be exposed by the first contact trench 220. The second section of the first contact trench 220 is a via that extends downwards through the bonding oxide 160 to expose a top surface of the backside via contact 170. The third contact trench 230 exposes a top surface and side surface of the upper source/drain 180B. The third contact trench 230 does not expose a portion of the long source/drain liner 190L. The fourth contact trench 235 extends downwards through the second interlayer dielectric layer 185 and the bonding oxide 160 to expose a surface of the second placeholder 155B.

FIGS. 26, 27, and 28 illustrate the processing stage after the removal of the second placeholder 155A, 155B. The second placeholder 155A and 155B are removed. The fourth contact trench 235 exposed a surface of the second placeholder 155B to allow for the material to be removed. Another contact trench (not shown) is connected to the second placeholder 155A to allow for its removal. The removal of the second placeholder 155A causes the formation of first cavity 237, where the first cavity 237 is located above the bottom source/drain 135. The first cavity 237 exposes a top surface of the bottom source/drain 135. As illustrated by FIG. 28 the removal of the second placeholder 155B causes a second cavity 238 to be formed. The second cavity 238 is connected to the fourth contact trench 235. The second cavity 238 extends horizontally to expose the top surface of the bottom source/drain 135B.

Figure 29:
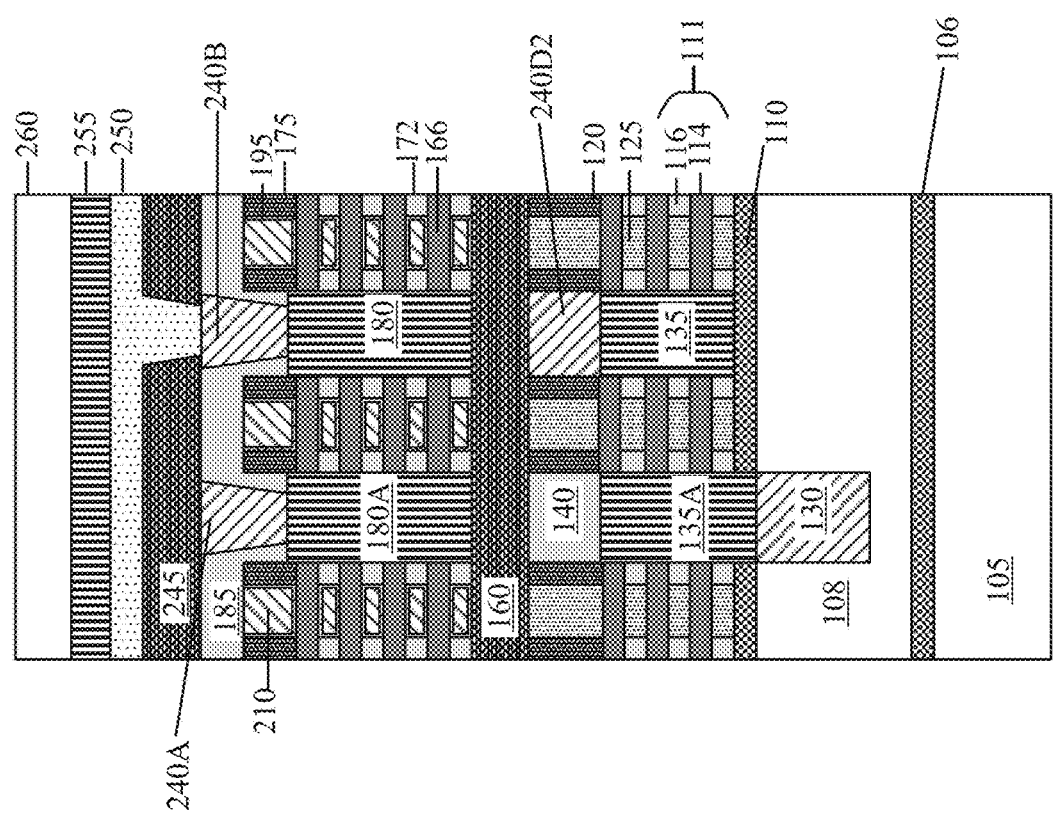
FIG. 29 illustrates a cross section X of the nano stack after the formation of contacts, metal lines, and additional layers, in accordance with the embodiment of the present invention.
Figure 30:
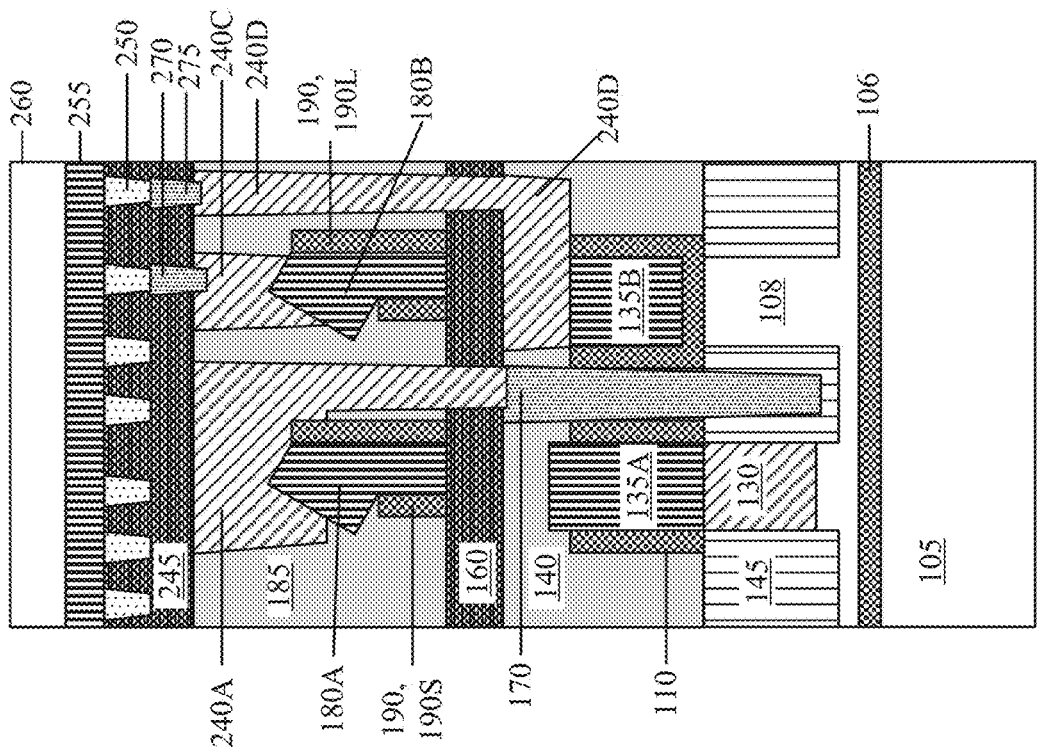
FIG. 30 illustrates a cross section Y1 of the gate region after the formation of contacts, metal lines, and additional layers, in accordance with the embodiment of the present invention.
Figure 31:
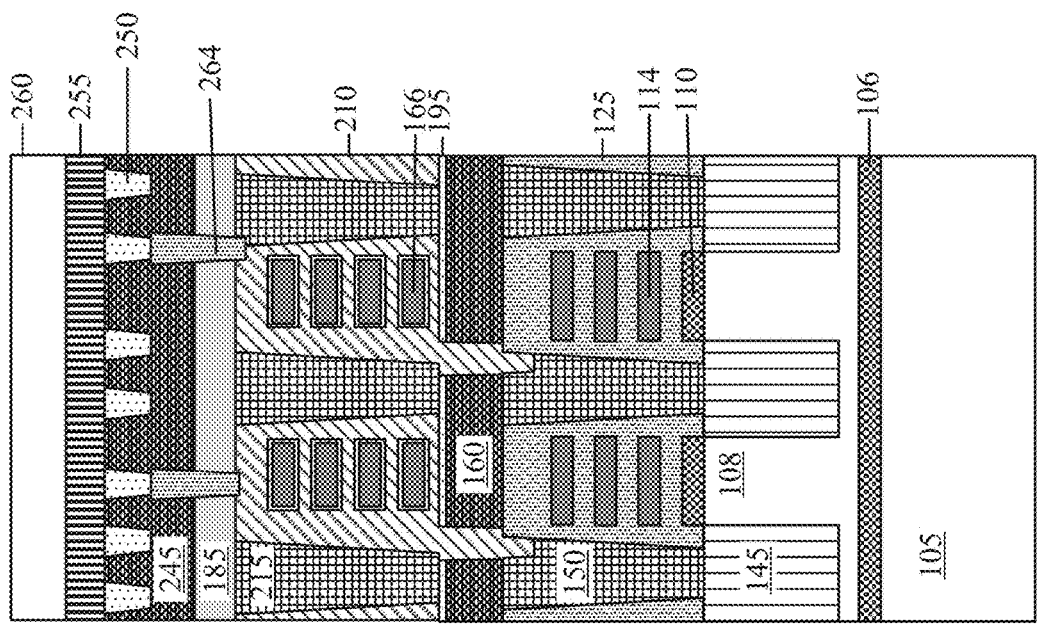
FIG. 31 illustrates a cross section Y2 of the source/drain region after the formation of contacts, metal lines, and additional layers, in accordance with the embodiment of the present invention.

FIGS. 29, 30, and 31 illustrate the processing stage after the formation of contacts, metal lines, and additional layers. The contact trenches 220, 225, 230, and 235, the first cavity 237, and the second cavity 238 are filled in with a conductive metal to form a plurality of contacts. A first contact 240A is formed from filling the first contact trench 220. The first contact 240A is connected to the top surface of the backside via contact 170. A second contact 240B is formed from filling the second contact trench 225. A third contact 240C is formed from filling the third contact trench 230. A fourth contact 240D is formed from filling the fourth contact trench 235 and the second cavity 238. The fourth contact 240D has a downwards via section and a bottom horizontal section that extends across the top surface of the bottom source/drain 135B. A fifth contact 240D2 is formed from filling a trench (not shown) and the first cavity 237. A dielectric layer 245 is formed on top of the second interlayer dielectric layer 185 and on top of the first contact 240A and the second contact 240B. A metal line 250 is formed in the dielectric layer 245 and the metal line 250 is connected to the second contact 240B as illustrated by FIG. 29.

As illustrated by FIG. 30, the dielectric layer 245 is located on top of the second interlayer dielectric layer 185. Trenches (not shown) are formed in the dielectric layer 245 and the second interlayer dielectric layer 185 to expose a top surface of the upper gate 210 of one of the upper devices. The trenches are filled with a conductive metal to form the gate contacts 264. A plurality of metal lines 250 are located in the dielectric layer 245, where one of the metal lines 250 is connected to the gate contacts 264. As illustrated by FIG. 31, the dielectric layer 245 is located on top of the second interlayer dielectric layer 185, the first contact 240A, the third contact 240C, and the fourth contact 240D. Trenches (not shown) are formed in the dielectric layer 245 and filled in with a conductive metal to form a first S/D contact 270 and a second S/D contact 275. The first S/D contact 270 is connected to the third contact 240C and the second S/D contact 275 is connected to the fourth contact 240D. A plurality of metal lines 250 are located in the dielectric layer 245, where one of the metal lines 250 is connected to the first S/D contact 270 and one of the metal lines 250 is connected to the second S/D contact 275. A backend-of-the-line (BEOL) layer 255 is formed on top of the dielectric layer 245 and on top of the metal lines 250. A carrier wafer 260 is formed on top of the BEOL layer 255. The carrier wafer 260 allows for flipping over the first substrate 105 and the backside processing of the device. FIGS. 32 to 43 illustrate the backside processing of the device; however, the figures do not illustrate that the device has been flipped over.

Figure 32:
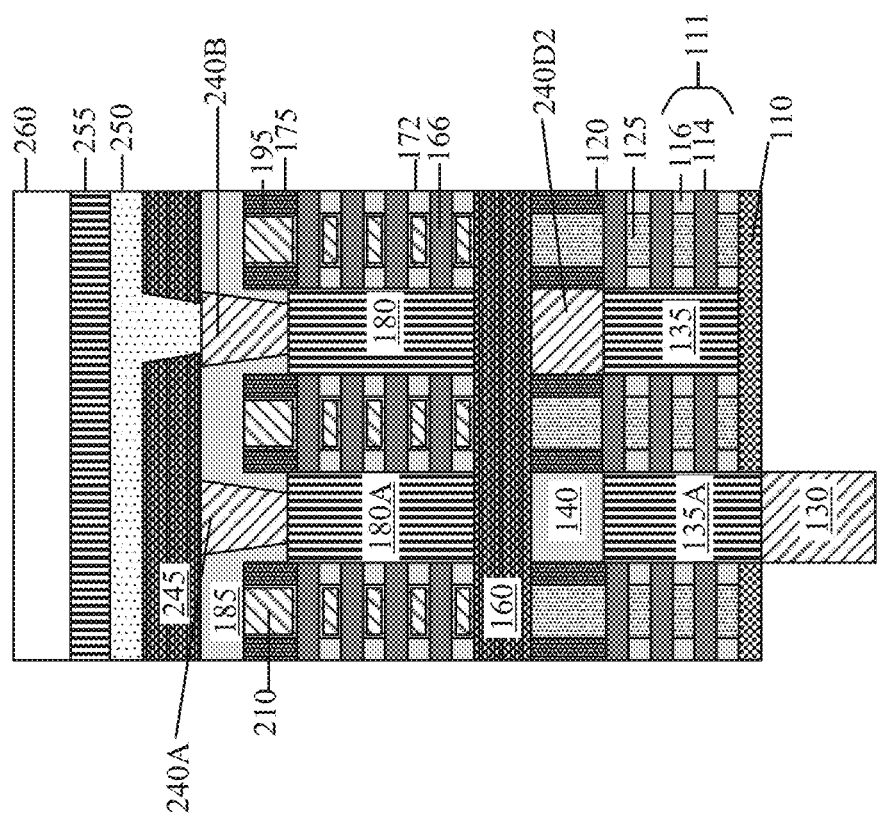
FIG. 32 illustrates a cross section X of the nano stack after the removal of the first substrate, the etch stop, and the second substrate, in accordance with the embodiment of the present invention.
Figure 34:
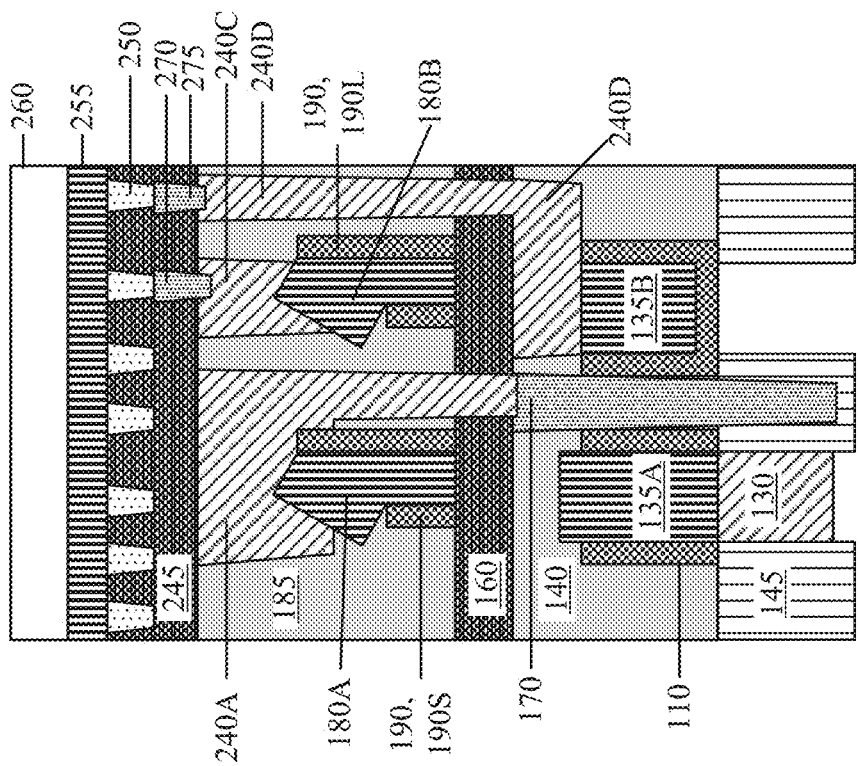
FIG. 34 illustrates a cross section Y2 of the source/drain region after the removal of the first substrate, the etch stop, and the second substrate, in accordance with the embodiment of the present invention.
Figure 33:
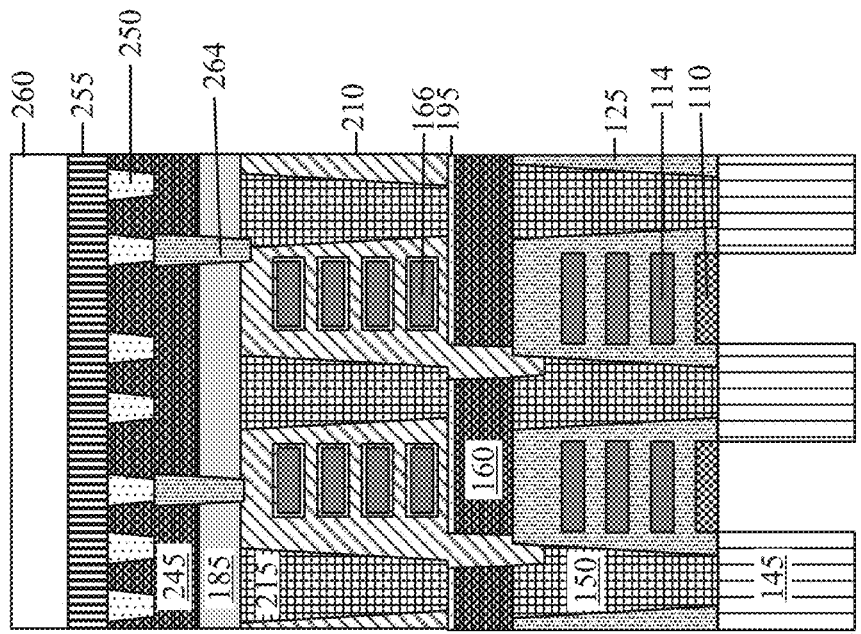
FIG. 33 illustrates a cross section Y1 of the gate region after the removal of the first substrate, the etch stop, and the second substrate, in accordance with the embodiment of the present invention.

FIGS. 32, 33, and 34 illustrate the processing stage after the removal of the first substrate 105, the etch stop 106, and the second substrate 108. After the device is flipped over (not shown), then the first substrate 108 is removed to expose the etch stop 106. The etch stop 106 and the second substrate 108 is removed to expose the first placeholder 130 and a backside surface of the BDI layer 110. As illustrated by FIGS. 33 and 34, the shallow trench isolation layer 145 is not removed.

Figure 35:
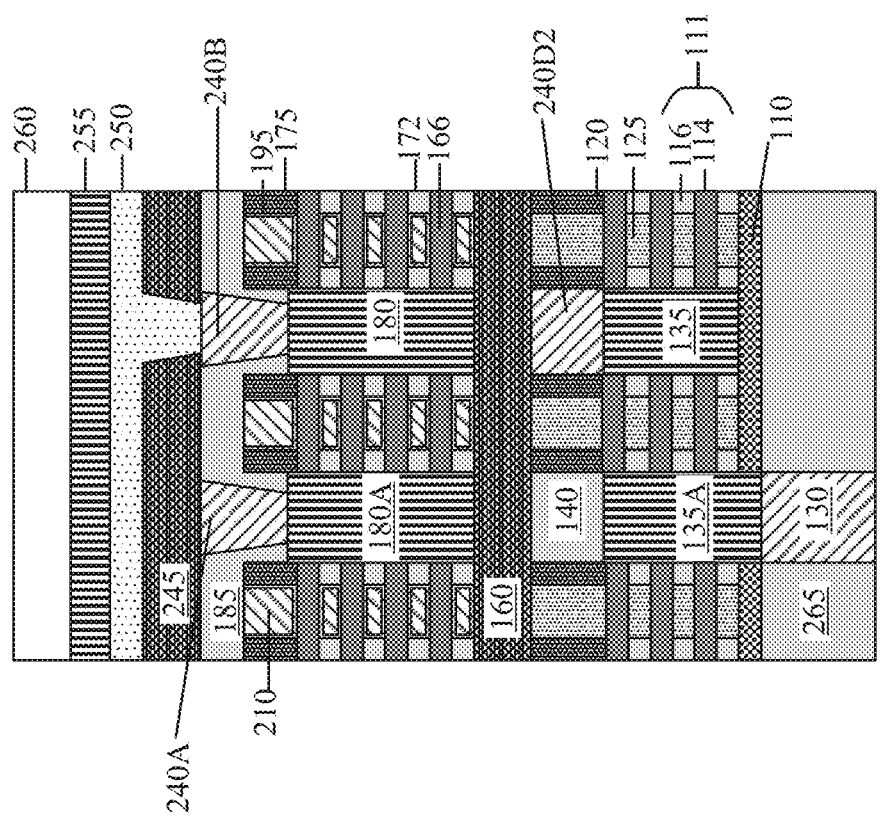
FIG. 35 illustrates a cross section X of the nano stack after the formation of the backside interlayer dielectric layer and a chemical-mechanical planarization process to expose a backside surface of the backside via contact, in accordance with the embodiment of the present invention.
Figure 37:
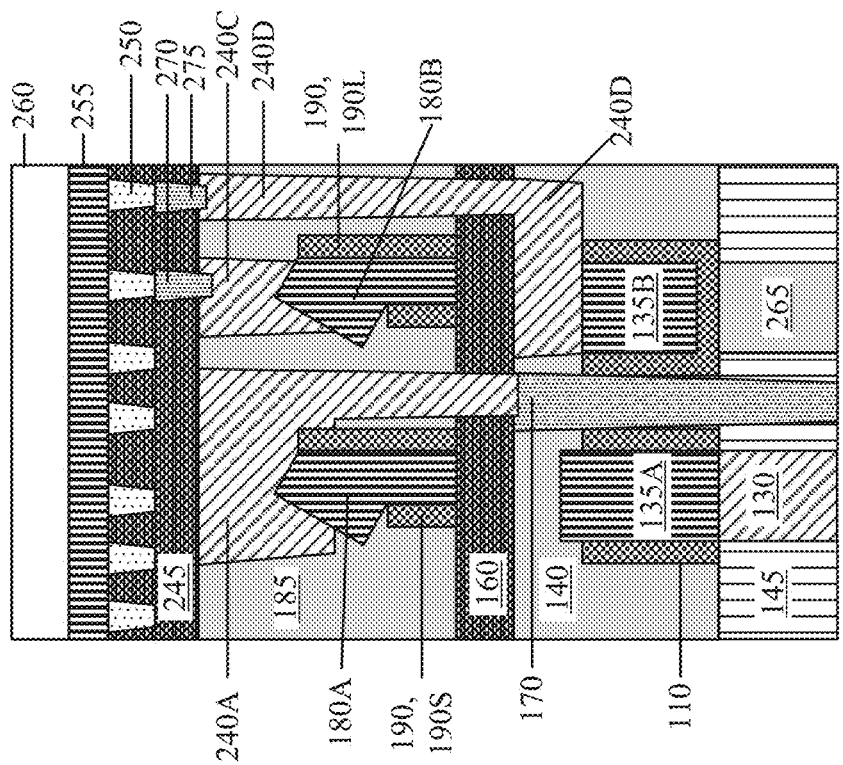
FIG. 37 illustrates a cross section Y2 of the source/drain region after the formation of the backside interlayer dielectric layer and a chemical-mechanical planarization process to expose a backside surface of the backside via contact, in accordance with the embodiment of the present invention.
Figure 36:
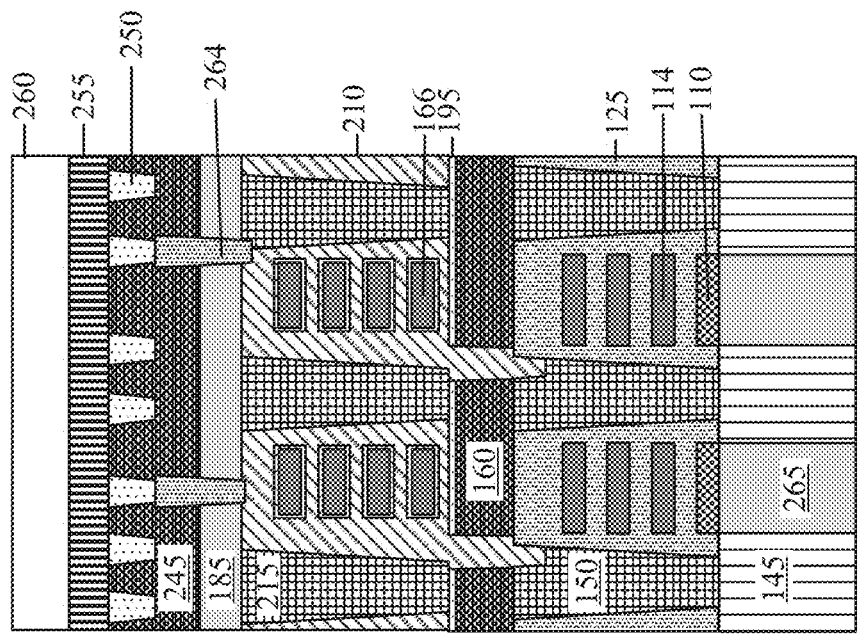
FIG. 36 illustrates a cross section Y1 of the gate region after the formation of the backside interlayer dielectric layer and a chemical-mechanical planarization process to expose a backside surface of the backside via contact, in accordance with the embodiment of the present invention.

FIGS. 35, 36, and 37 illustrate the processing stage after the formation of the backside interlayer dielectric layer 265 and a chemical-mechanical planarization process to expose a backside surface of the backside via contact 170. A backside interlayer dielectric layer 265 is formed on the backside surface of the BDI layer 110 to surround the first placeholder 130 and to fill in the gaps between sections of the shallow trench isolation layer 145. Excess backside interlayer dielectric layer 265 is removed by a chemical-mechanical planarization (CMP) to expose a backside surface of the shallow trench isolation layer 145, a backside surface of the first placeholder 130, and a backside surface of the backside via contact 170.

Figure 38:
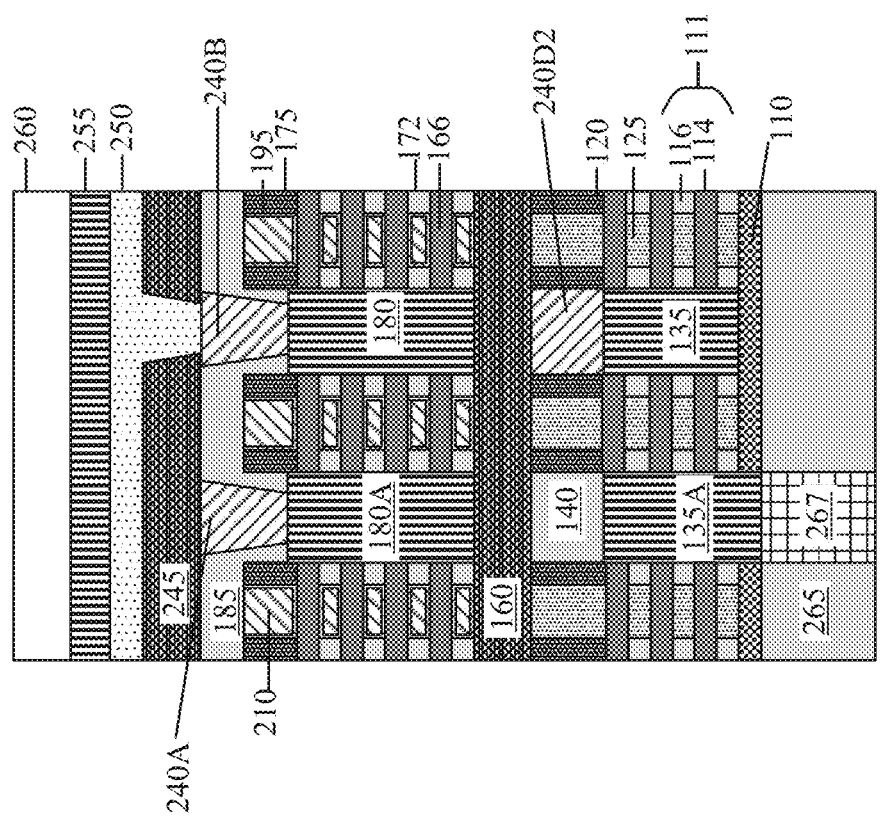
FIG. 38 illustrates a cross section X of the nano stack after the removal of the first placeholder and the formation of a backside contact, in accordance with the embodiment of the present invention.
Figure 40:
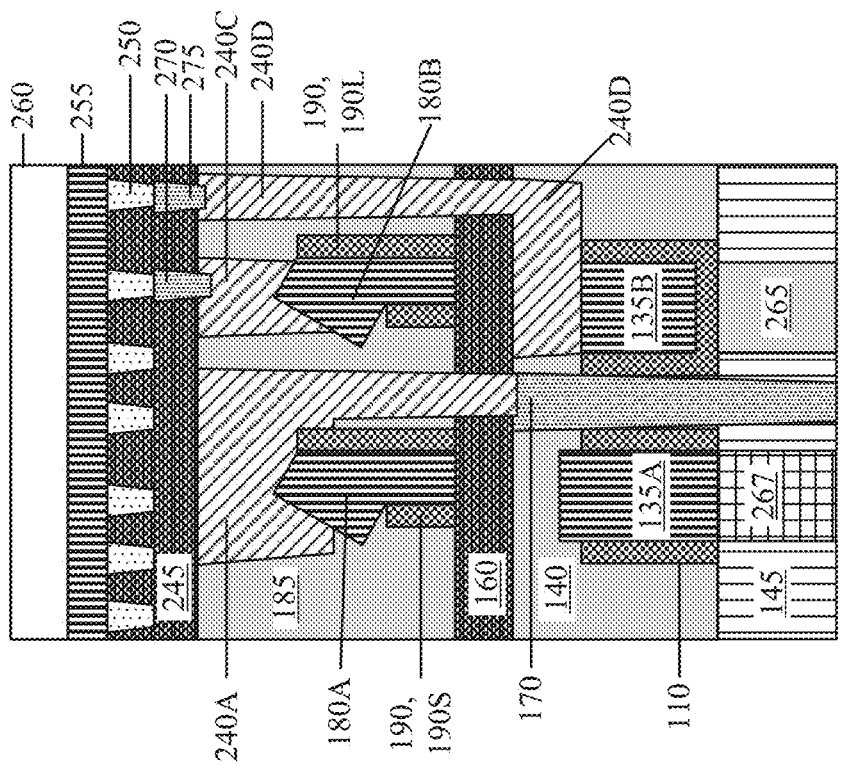
FIG. 40 illustrates a cross section Y2 of the source/drain region after the removal of the first placeholder and the formation of a backside contact, in accordance with the embodiment of the present invention.
Figure 39:
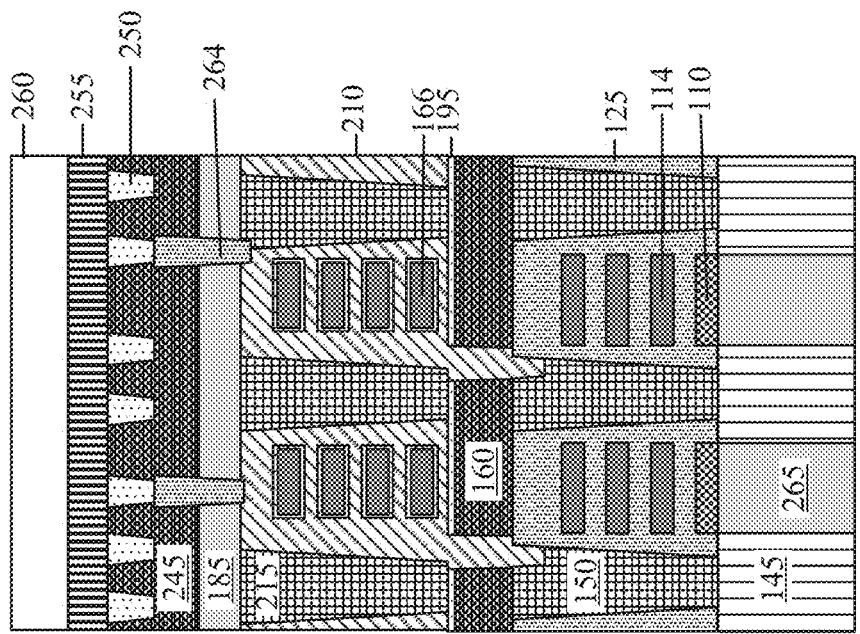
FIG. 39 illustrates a cross section Y1 of the gate region after the removal of the first placeholder and the formation of a backside contact, in accordance with the embodiment of the present invention.

FIGS. 38, 39, and 40 illustrate the processing stage after the removal of the first placeholder 130 and the formation of a backside contact 267. The first placeholder 130 is removed to expose a backside surface of the bottom source/drain 135A. The space where the first placeholder 130 was located is filled with a conductive metal to form the backside contact 267. The backside contact 267 is connected to the backside surface of the bottom source/drain 135A. As illustrated by FIG. 40, a portion of the shallow trench isolation layer 145 is located between the backside contact 267 and the backside via contact 170 to prevent shorts between the backside contact 267 and the backside via contact 170.

Figure 41:
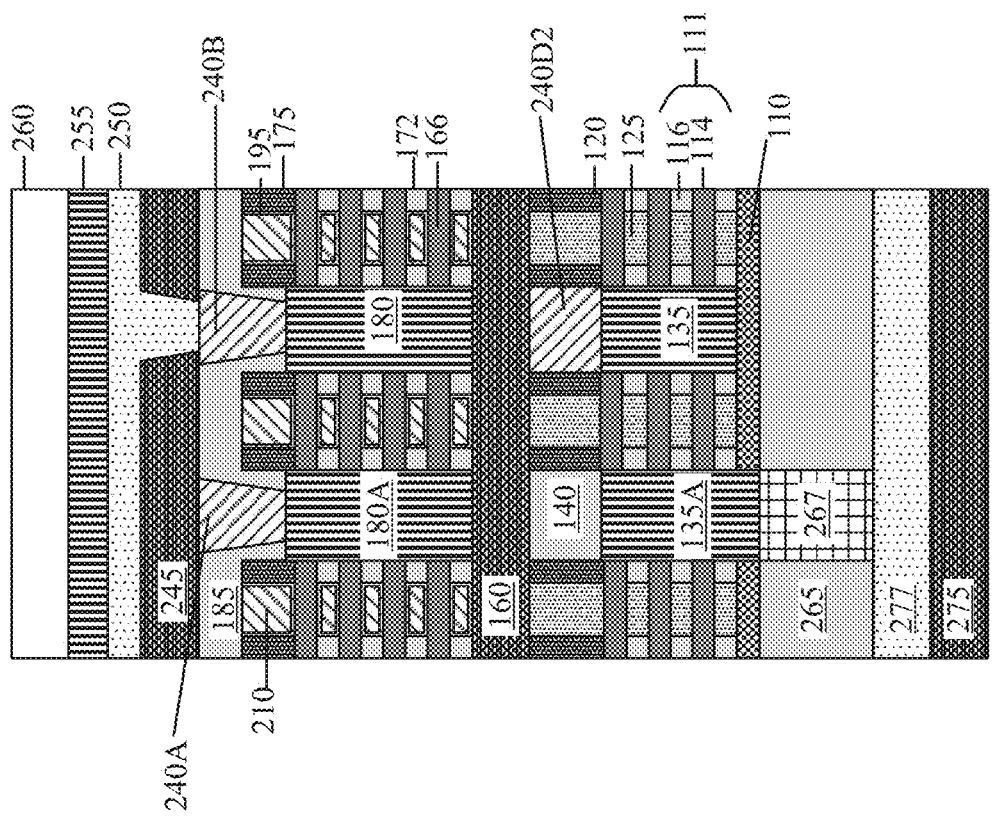
FIG. 41 illustrates a cross section X of the nano stack after the formation of the backside metal lines and the formation of the backside-power-distribution-network, in accordance with the embodiment of the present invention.
Figure 43:
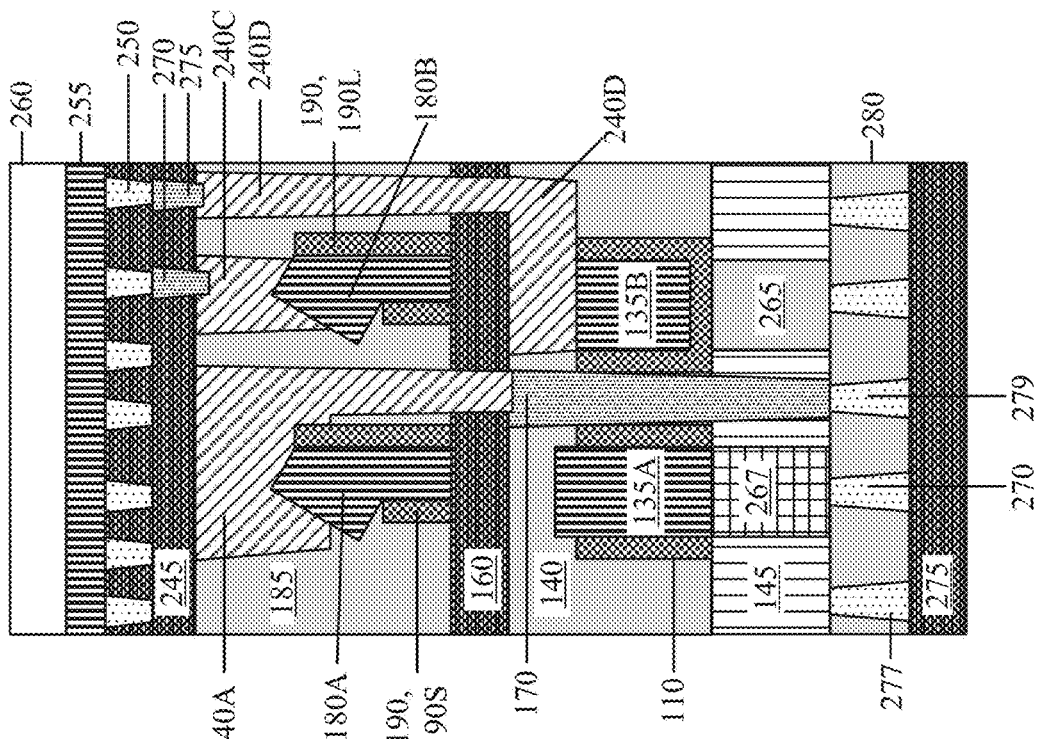
FIG. 43 illustrates a cross section Y2 of the source/drain region after the formation of the backside metal lines and the formation of the backside-power-distribution-network, in accordance with the embodiment of the present invention.
Figure 42:
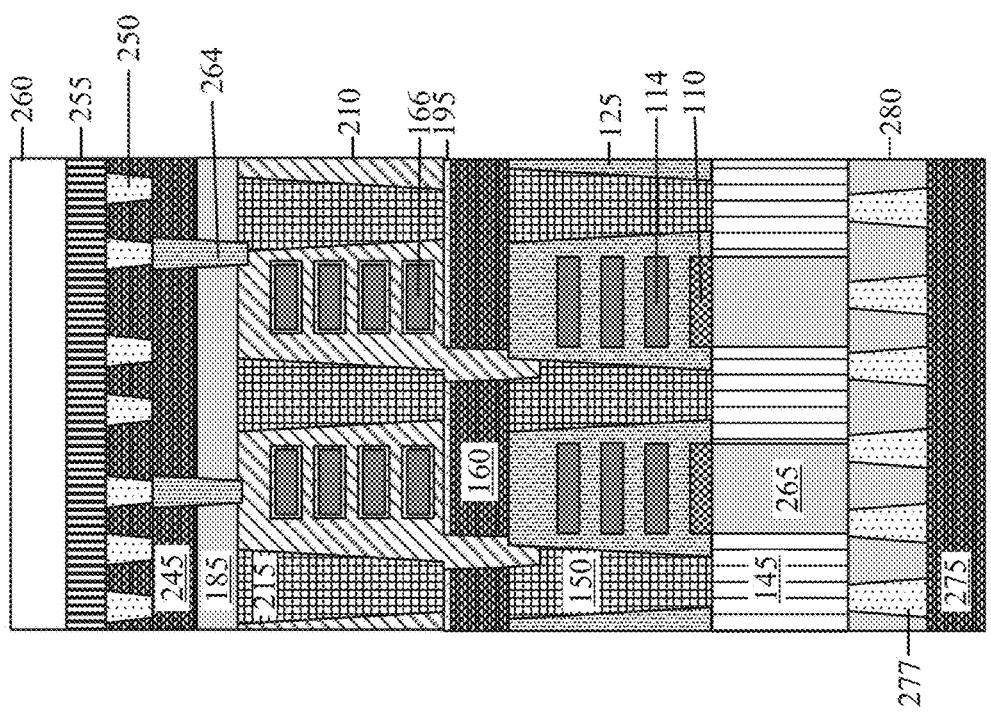
FIG. 42 illustrates a cross section Y1 of the gate region after the formation of the backside metal lines and the formation of the backside-power-distribution-network, in accordance with the embodiment of the present invention.

FIGS. 41, 42, and 43 illustrate the processing stage after the formation of the backside metal lines and the formation of the backside-power-distribution-network 275. As illustrated by FIG. 41, a backside metal line 277 is located on the backside surface of the backside interlayer dielectric layer 265 and the backside contact 267. FIG. 42 illustrates a plurality of backside metal lines 277 are surrounded by additional backside interlayer dielectric layer 280. FIG. 43 illustrates backside metal line 277 is connected to the backside contact 267 and the backside metal line 279 is connected to the backside via contact 170. A backside-power-distribution-network 275 is formed on a backside surface of the backside metal lines 277, 270, 280, and the additional backside interlayer dielectric layer 280.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
   a first stacked FET device that includes a first bottom FET device and a first upper FET device, wherein the first bottom FET device include a plurality of first bottom channel layers, wherein the first upper FET device includes a plurality of first upper channel layers;
   a bottom gate that surrounds the plurality of first bottom channel layers;
   an upper gate that surrounds the plurality of first upper channel layers; and
   a gate protrusion that extends downwards from a backside of the upper gate to connected to the bottom gate, wherein the gate protrusion partially overlaps with a bottom gate cut region of the first bottom stacked FET device, and the gate protrusion partially overlaps with an upper gate cut region of the first upper stacked FET device.

2. The microelectronic structure of claim 1, further comprising:
   a second stacked FET device that is located parallel to the first stacked FET device, wherein the second stacked FET device includes a second bottom FET device and second upper FET device, wherein the second bottom FET device include a plurality of second bottom channel layers, wherein the second upper FET device includes a plurality of second upper channel layers, wherein the second bottom FET device includes a fifth source/drain, wherein the second upper FET device includes a sixth source/drain;
   a first source/drain contact connected to a backside surface of the first source/drain;
   a second source/drain contact connected to the third source/drain, wherein the second source/drain contact is comprised of a first section and a second section, wherein the first section is connected a top surface and a sidewall of the third source/drain, wherein the second section is a via that extends to a backside of the first stacked FET device; and
   a third source/drain contact that is connected to a top surface of the fifth source/drain.

3. The microelectronic structure of claim 2, further comprising:
   a backside via contact located between the first source/drain and the fifth source/drain.

4. The microelectronic structure of claim 2, wherein a backside surface of the second section of the second source/drain contact is connected to a frontside surface of the backside via contact.

5. The microelectronic structure of claim 1, further comprising:
   a bonding oxide layer that is located between the first bottom FET device and the first upper FET device.

6. The microelectronic structure of claim 5, wherein the protrusion of the upper gate is in contact with a frontside surface and a sidewall of the bottom gate.

7. The microelectronic structure of claim 6, wherein the first bottom channel layers have a first width across a gate region, wherein the first upper channel layers have a second width across the gate region.

8. The microelectronic structure of claim 7, wherein the first width is larger than the second width.

9. A microelectronic structure comprising:
   a first stacked FET device that includes a first bottom FET device and a first upper FET device, wherein the first bottom FET device include a plurality of first bottom channel layers, wherein the first upper FET device includes a plurality of first upper channel layers, wherein the first bottom FET device includes a first and second source/drain, wherein the first upper FET device includes a third and fourth source/drain, wherein the third and fourth source/drain have asymmetric shape, wherein the asymmetric shape of the third and fourth source/drain are comprised of a narrow section and a wide section, respectively;
   a dielectric liner is located on sidewalls of the third and fourth source/drain, respectively; and
   a first source/drain contact connected to the third source/drain, wherein the first source/drain contact is comprised of a first section and a second section, wherein the first section is connected to a top surface and a sidewall of the third source/drain, wherein the second section is a via that extends to a backside of the first stacked FET device.

10. The microelectronic structure of claim 9, further comprising:
   a second stacked FET device that is located parallel to the first stacked FET device, wherein the second stacked FET device includes a second bottom FET device and second upper FET device, wherein the second bottom FET device include a plurality of second bottom channel layers, wherein the second upper FET device includes a plurality of second upper channel layers, wherein the second bottom FET device includes a fifth source/drain, wherein the second upper FET device includes a sixth source/drain;
   a second source/drain contact connected to a backside surface of the first source/drain; and
   a third source/drain contact that is connected to the fifth source/drain, wherein the third source/drain is comprised of a third section and a fourth section, wherein the third section is a via that extends from the second upper FET device towards the second bottom FET device, wherein the fourth section extends horizontally from the third section across a top surface of the fifth source/drain.

11. The microelectronic structure of claim 9, wherein the dielectric liner includes a first vertical segment located on a first side of the third source/drain, and the dielectric liner include a second vertical segment located on a second side of the third source/drain.

12. The microelectronic structure of claim 11, wherein a vertical height of the first vertical segment and a vertical height of the second vertical segment are different.

13. The microelectronic structure of claim 12, wherein the third source/drain is comprised of a first area and a second area, wherein the first area is sandwiched between the first vertical segment and the second vertical segment.

14. The microelectronic structure of claim 13, wherein the second area of third source/drain extends horizontal on top of the first vertical segment.

15. The microelectronic structure of claim 14, wherein the second first section of the first source/drain contact is in contact with the dielectric liner is in contact with the second vertical segment of the dielectric liner.

16. The microelectronic structure of claim 15, further comprising:
   a bottom gate that surrounds the plurality of first bottom channel layers;
   an upper gate that surrounds the plurality of first upper channel layers; and
   a bonding oxide layer that is located between the first bottom FET device and the first upper FET device.

17. The microelectronic structure of claim 16, wherein the upper gate includes a protrusion that extends through the bonding oxide to connected to the bottom gate.

18. The microelectronic structure of claim 17, wherein the protrusion of the upper gate is in contact with a frontside surface and a sidewall of the bottom gate.

19. A method comprising:
   forming a first stacked FET device that includes a first bottom FET device and a first upper FET device, wherein the first bottom FET device include a plurality of first bottom channel layers, wherein the first upper FET device includes a plurality of first upper channel layers, wherein the first bottom FET device includes a first and second source/drain, wherein the first upper FET device includes a third and fourth source/drain;
   forming a dielectric liner is located on sidewalls of the third and fourth source/drain, respectively, wherein the dielectric liner includes a first vertical segment located on a first side of the third source/drain, and the dielectric liner include a second vertical segment located on a second side of the third source/drain;
   forming a second stacked FET device that is located parallel to the first stacked FET device, wherein the second stacked FET device includes a second bottom FET device and second upper FET device, wherein the second bottom FET device include a plurality of second bottom channel layers, wherein the second upper FET device includes a plurality of second upper channel layers, wherein the second bottom FET device includes a fifth source/drain, wherein the second upper FET device includes a sixth source/drain;
   forming a first source/drain contact connected to a backside surface of the first source/drain;
   forming a second source/drain contact connected to the third source/drain, wherein the second source/drain contact is comprised of a first section and a second section, wherein the first section is connected a top surface and a sidewall of the third source/drain, wherein the second section is a via that extends to a backside of first stacked FET device; and
   forming a third source/drain contact that is connected to the fifth source/drain, wherein the third source/drain is comprised of a third section and a fourth section, wherein the third section is a via that extends from the second upper FET device towards the second bottom FET device, wherein the fourth section extends horizontally from the third section across a top surface of the fifth source/drain.

20. The method of claim 19, comprising:
   pulling down the first vertical segment, such that, a vertical height of the first vertical segment and a vertical height of the second vertical segment are different.

* * * * *